(12) United States Patent
Cobos et al.

(10) Patent No.: US 11,163,080 B2
(45) Date of Patent: Nov. 2, 2021

(54) COMPUTER IMPLEMENTED METHOD FOR GENERATING A SUBSURFACE ROCK AND/OR FLUID MODEL OF A DETERMINED DOMAIN

(71) Applicants: REPSOL EXPLORACIÓN, S.A, Madrid (ES); ROCK SOLID IMAGES, INC., Houston, TX (US)

(72) Inventors: Carlos Cobos, The Woodlands, TX (US); Marco Zanzi, The Woodlands, TX (US); Lucy MacGregor, Edinburgh (GB); Francisco Bolivar, Houston, TX (US); Pedro Alvarez, Houston, TX (US); David Andreis, Houston, TX (US); Dario Grana, Laramie, WY (US)

(73) Assignee: REPSOL EXPLORACIÓN, S.A, Madrid (ES)

( * ) Notice: Subject to any disclaimer, the term of this patent is extended or adjusted under 35 U.S.C. 154(b) by 402 days.

(21) Appl. No.: 15/983,452

(22) Filed: May 18, 2018

(65) Prior Publication Data
US 2019/0353813 A1    Nov. 21, 2019

(51) Int. Cl.
*G01V 1/30* (2006.01)
*G01V 1/28* (2006.01)
*G06F 30/20* (2020.01)

(52) U.S. Cl.
CPC .............. *G01V 1/306* (2013.01); *G01V 1/282* (2013.01); *G06F 30/20* (2020.01)

(58) Field of Classification Search
CPC ................................. G01V 1/306; G01V 1/282
USPC .......................................................... 702/6
See application file for complete search history.

(56) References Cited

U.S. PATENT DOCUMENTS

| | | | |
|---|---|---|---|
| 7,912,649 B2 | 3/2011 | Harris et al. | |
| 8,095,345 B2 | 1/2012 | Hoversten | |
| 8,363,509 B2 | 1/2013 | Colombo et al. | |
| 8,729,903 B2 | 5/2014 | Srnka et al. | |
| 9,207,356 B2 | 12/2015 | Chen et al. | |
| 9,383,475 B2 | 7/2016 | MacGregor et al. | |
| 10,393,913 B2* | 8/2019 | Kherroubi | G01V 3/18 |
| 10,621,292 B2* | 4/2020 | Ferreira | G06F 30/20 |
| 2011/0264421 A1 | 10/2011 | Jing et al. | |
| 2013/0179130 A1 | 7/2013 | Zhandov | |

(Continued)

FOREIGN PATENT DOCUMENTS

| | | |
|---|---|---|
| GB | 2445246 A | 7/2008 |
| WO | WO2014165478 A1 | 10/2014 |
| WO | WO2015104052 A1 | 7/2015 |

OTHER PUBLICATIONS

Robert L. Cook, "Stochastic Sampling in Computer Graphics" Jan. 1986, ACM Transactions on Graphics, vol. 5, No. 1, pp. 51-72.*

(Continued)

*Primary Examiner* — Eman A Alkafawi
(74) *Attorney, Agent, or Firm* — Reising Ethington P.C.

(57) ABSTRACT

A computer implemented method is provided for generating a subsurface rock and/or fluid model on a determined domain. The subsurface rock and/or fluid model generated by the invention combines acoustic data and data obtained by an electromagnetic survey in such a way that the resulting model avoids the need of generating an image of the resistivity with the low resolution imposed by the known techniques inverting EM electromagnetic survey data.

15 Claims, 22 Drawing Sheets

(56) References Cited

U.S. PATENT DOCUMENTS

| | | | |
|---|---|---|---|
| 2014/0297187 A1 | 10/2014 | Miotti et al. | |
| 2018/0058211 A1* | 3/2018 | Liang | G01V 1/282 |
| 2018/0156932 A1* | 6/2018 | Sain | G01V 1/282 |

OTHER PUBLICATIONS

Abubakar A et al., "Paper; Joint inversion approaches for geophysical electromagnetic and elastic full-waveform data; Joint inversion approaches for geophysical electromagnetic and elastic full-waveform data", Inverse Problems, Institute of Physics Publishing, Bristol, GB, vol. 28, No. 5, Apr. 23, 2012, p. 55016, XP020222062, ISSN: 0266-5611, 001:10.1088/0266-5611/28/5/055016 (19 pages).

Moorkamp Max Ed—Gordillo Vazquez F J et al., "Integrating Electromagnetic Data with other Geophysical Observations for Enhanced Imaging of the Earth: A Tutorial and Review", Surveys in Geophysics, Reidel Dordrecht, NL, vol. 38 No. 5, May 18, 2017, pp. 935-962, XP036376481, ISSN: 0169-3298,001:10.1007/810712-017-9413-7.

Paolo Dell'Aversana et al., "A Global Integration Platform for Optimizing Cooperative Modeling and Simultaneous Joint Inversion of Multi-domain Geophysical Data", Aims Geosciences, vol. 2 No. 1, Jan. 1, 2016, pp. 1-31, XP055436734, ISSN: 2471-2132,001:10.3934/geosciences.2016.1.1.

European Search Report for Application No. EP19174494 dated Oct. 8, 2019 (3 pages).

Alcocer, J.A.E, Garcia, M.V., Soto, H.S., Baltar, D., Paramo, V.R., Gabrielson, P. & Roth, F., Apr. 2013. Reducing uncertainty by integrating 3D CSEM in the Mexican deepwater workflow, First Break, vol. 31, pp. 75-79.

Alvarez, P., Alvarez, A., MacGregor, L., Bolivar, F., Keirstead, R. & Martin, T., 2016. Reservoir property prediction using CSEM, pre-stack seismic and well log data: Case study in the Hoop Area, Barents Sea, Norway, May 2017, Interpretation, 5, pp. SE43-SE60.

Buland, A., And O. Kolbjørnsen, Jan.-Feb. 2012, Bayesian inversion of CSEM and magnetotelluric data: Geophysics, vol. 77, No. 1, pp. E33-E42.

Chen, J. and Hoversten, G.M., Jan.-Feb. 2012. Joint inversion of marine seismic AVA and CSEM data using statistical rock physics and Markov random fields, Geophysics, vol. 77, No. 1, pp. R65-R80.

Emerick, A. and A. Reynolds, 2013, Ensemble smoother with multiple data assimilation: Computers & Geosciences, 55, 3-15, 53 pages.

Gallardo, L.A., and M.A. Meju, Mar. 2004, Joint two-dimensional DC resistivity and seismic travel time inversion with cross-gradient constraints: J. Geophysical Research, vol. 109, BO3311, doi: 10.1029/2003JB002716, 11 pages.

Gao, G., Abubakar, A., and Habashy, T.M., May-Jun. 2012, Joint petrophysical inversion of electromagnetic and full waveform seismic data, Geophysics, vol. 77, No. 3, pp. WA3-WA18.

Gist, G., Adrian Ciucivara, Rich Houck, Mike Rainwater, Denny Willen & Jin-Juan Zhou, 2013, Case study of a CSEM false positive—Orphan basin, Canada, SEG Expanded Abstract, SEG Houston Annual meeting 2013, pp. 805-809.

Grana, D & Della Rossa, E., May-Jun. 2010, Probabilistic petrophysical-properties estimation integrating statistical rock physics with seismic inversion, Geophysics, vol. 75, No. 3, pp. 021-037.

Haber, E., and D. Oldenburg, 1997, Joint inversion: a structural approach: Inverse Problems, 13, pp. 63-77.

Harris, P., Du, Z., MacGregor, L., Olsen, W., Shu, R., & Cooper, R., May 2009. Joint interpretation of seismic and CSEM data using well log constraints: an example from the Luva field, First Break, vol. 27, pp. 73-81.

Hoversten, G.M., Cassassuce, F., Gasperikova, E., Newman, G., Chen, J., Rubin, Y., Hou, Z., and Vasco, D., May-Jun. 2006, Direct reservoir parameter estimation using joint inversion of marine seismic AVA and CSEM data: Geophysics, vol. 71, No. 3, pp. C1-C13.

Hou, Z., Rubin, Y., Hoversten, G.M., Vasco, D., and Chen, J., Nov.-Dec. 2006, Reservoir-parameters identification using minimum-entropy based Bayesian inversion of seismic AVA and marine CSEM data Geophysics, vol. 71, No. 6, pp. O77-O88.

Lovatini, A., Umpbach, K. & Patmore, S., May 2009. 3D CSEM in a frontier basin offshore Greenland, First Break, vol. 27, pp. 95-98.

MacGregor, L.M., Integrating seismic, CSEM and well log data for reservoir characterisation, The Leading Edge, Mar. 2012, pp. 268-277.

MacGregor, L.M., Bouchrara, S., Tomlinson, J.T., Strecker, U., Fan, J., Ran, X. & Yu, G., 2012. Integrated analysis of CSEM, seismic and well log date for prospect appraisal: a case study from West Africa, First Break, vol. 30, pp. 77-82.

MacGregor, L.M. & Sinha M.C., 2000. Use of marine controlled source electromagnetic sounding for sub-basalt exploration. Geophysical Prospecting, 48, pp. 1091-1106.

Miotti, F., Guerra, I., Ceci, F., Lovatini, A., Paydayesh, M., Leathard, M. & Sharma, A., 2013. Petrophysical Joint Inversion of seismic and EM attributes: a case study, SEG Houston annual meeting 2013, expanded abstract, pp. 2516-2521.

Moorkamp, M., Heincke, H., Jegen, M., Roberts, A.W., and Hobbs, R.W., 2010, A framework for 3D joint inversion of MT, gravity and seismic refraction data: Geophysical Journal International, 184, 477-493, 17 pages.

Pafeng, J., Grana, D. & Mallick, S., 2014. Joint rock physics inversion of elastic and electric attributes for rock and fluid properties—a real data example, SEG Denver annual meeting 2014, expanded abstract, pp. 2616-2620.

Ray, A. & Key, K., 2012. Bayesian inversion of marine CSEM data with a trans-dimensional self parametrizing algorithm. Geophys. J. Int., doi: 10.1111/j.1365-246X.2012.05677.x, 17 pages.

Miotti, F., Zerilli, A., Menezes, P., Crepaldi, JS. & Adriano, V., Feb. 5, 2018, A new petrophysical joint inversion workflow: Advancing on reservoir characterisation challenges. Interpretation, 6, SG33-SG39, 23 pages.

* cited by examiner

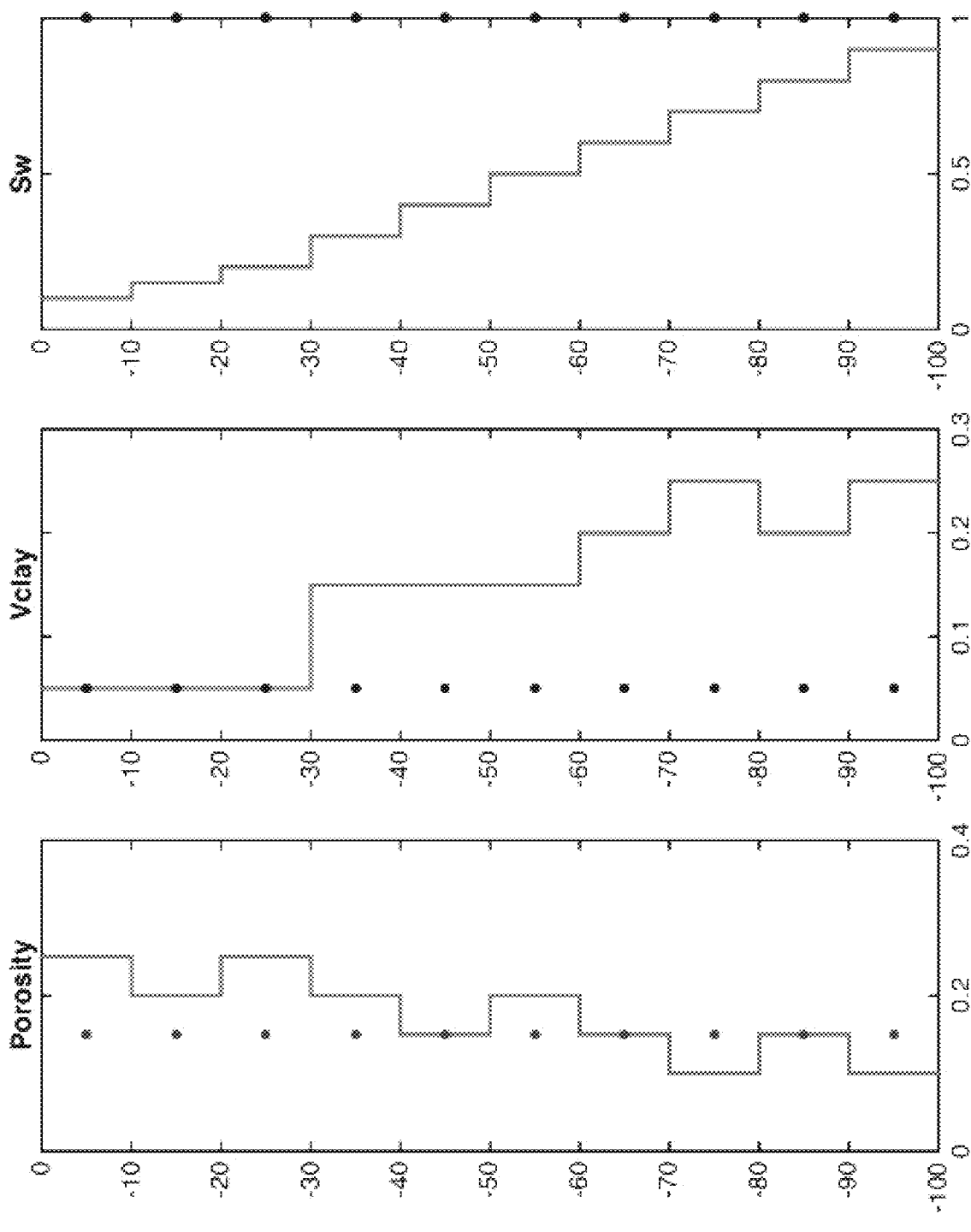
FIG. 5a ① Starting model

② First elastic iteration

③ First electric iteration

④ Second elastic iteration

COMPUTER IMPLEMENTED METHOD FOR GENERATING A SUBSURFACE ROCK AND/OR FLUID MODEL OF A DETERMINED DOMAIN

FIELD OF THE INVENTION

The present invention is related to a computer implemented method for generating a subsurface rock and/or fluid model of a determined domain. The subsurface rock and/or fluid model generated by the invention combines acoustic data and data obtained by an electromagnetic survey in such a way that the resulting model avoids the need to generate an image of the resistivity with the low resolution imposed by the known techniques for inverting EM electromagnetic survey data.

BACKGROUND

Seismic imaging is one of the more advanced technical fields for determining underground rock structures to reveal possible crude oil or gas bearing formations.

Seismic imaging is based on the use of hydrophones or geophones to record the sound waves as they echo within the earth. In a seismic exploration survey, a source at the surface emits wavefields and these wavefields propagate downward into subsurface. The down-going wavefields are reflected/diffracted/refracted by the interfaces of the structures encountered, and then propagate upward to the surface where groups of sensors are installed at certain limited distances from the source to acquire the returned wavefields.

Features of the subsurface are detected by analyzing the time it takes for reflected seismic waves to travel through the subsurface matter of varying densities and velocities, and by analyzing the amplitude of the returned wavefields.

The acquired wavefields from an experiment are first migrated to image subsurface structures according to wave propagation theory, assuming the velocity model of subsurface is known or can be calculated. The migration process correctly positions layers or objects in the earth that cause the returned wavefield. Following this process data may be inverted to determine the acoustic and/or elastic properties of the subsurface. These properties may be (for example), acoustic impedance, elastic impedance, density or other attributes derived from these.

Data from the seismic excitation involved in the seismic survey, recorded data of the reflected wavefields and migrated seismic data are hereinafter being identified as seismic survey data.

The domain to be explored is represented by a model over a discrete domain, comprising voxels if the domain is a 3D space or pixels if the domain is a 2D space, wherein each voxel/pixel represents the propagation velocity (either P-wave or S-wave), the elastic impedance, the acoustic impedance, the density or other derived attributes for example Poisson's Ratio (PR) or Vp/Vs ratio (all scalar values) of the rock at the location of said voxel/pixel. If the image and the domain is 1D, the term pixel will also be used for representing a specific value at certain location of the 1D domain.

This specific value will be interpreted in a general manner. In many cases, pixels or voxels represent a scalar value but, in the context of the invention, a plurality of values at a certain location may be represented by the same pixel or voxel. In these cases more complex data structures may be implemented for storing said complex data such as, just as a clarifying example, a plurality of properties being assigned at the same location or those anisotropic properties that are at each location.

A skilled person in the art may choose, just as an example, an implementation of layers in the images comprising pixels or voxels or, even more complex implementations wherein each pixel or voxel represent a pointer to a complex data record.

There is a close relationship between the rock properties and the acoustic and/or elastic attributes and therefore the attribute field forms the basis for describing and identifying the rock material in the domain; however, many kind of rocks may show the same or very similar acoustic and/or elastic attribute values.

As the acoustic and/or elastic attributes depend on the rock properties, the model allows the shape and distribution of the rock properties to be identified, not the rock properties themselves because of this non-uniqueness. The same applies to fluid properties. That is, a specific value of the acoustic and/or electric attributes identifies one or more rocks or fluids showing that propagation value but, once the rock and its properties are identified, the acoustic and/or elastic attributes may be determined.

The seismic model discloses the acoustic or elastic properties of the domain and it is part of a numerical model, identified as the acoustic or elastic model, representing the geological structure of a region of the subsurface. This acoustic or elastic model may comprise additional information such as the shape of the domain.

Another model that will be identified in this invention is the rock and/or fluid model comprising data such as the assigned rock and/or fluid properties, the shape of the domain or other properties that may not be derived uniquely from acoustic or elastic data.

This rock and/or fluid model comprises rock and/or fluid properties are compatible with the acoustic or elastic model.

A rock and/or fluid model may comprise, according to some embodiments of the invention, other properties being associated to the fluid model such as porosity, pore connectivity, saturation, permeability, water content, lithology, clay content, etc.

Such numerical model allows in a further stage the simulation of a perforation or exploitation processes in order to reach an optimal plan. Said subsequent simulations need accurate numerical models for reducing the uncertainty.

A numerical model only being determined from seismic survey data alone can be used to determine a model of rock and fluid properties, however these can be ambiguous when based only on seismic data. Including data from an alternative geophysical method can reduce the uncertainty in the determination of rock and fluid properties.

One such approach is to include electromagnetic (EM) survey data in the analysis. This could be in the form of natural source EM surveys where naturally generated EM fields are used as a source, or Controlled Source EM (CSEM) methods wherein the source is transmitted by an antenna (usually an electric or magnetic dipole) emitting an electromagnetic field that propagates according to the electromagnetic properties of the material located below the antenna.

Both natural source and CSEM survey methods can be employed onshore and offshore, for identifying hydrocarbons, minerals, geothermal areas or other features of interest. For example, it is known to apply CSEM methods offshore employing electromagnetic remote-sensing technology to identify hydrocarbon accumulations below the seabed. Similarly, it is known to apply CSEM methods onshore to identify mineral or hydrocarbon accumulations. It is also known to employ EM surveying methods crosswell, where an EM source is deployed in one well, and the resulting EM fields are measured in by receivers deployed in neighbouring boreholes. In the context of this application, the EM method is interpreted in the widest sense wherein the electromagnetic survey may be carried onshore or offshore using natural source or controlled source methods, and sources and/or receivers may be deployed at the earth's surface, sea surface, seafloor or downhole.

Data of the electromagnetic excitation involved in the EM survey and recorded data of the induced electromagnetic fields are hereinafter being identified as electromagnetic survey data or EM survey data in short.

In most cases, the electromagnetic excitation involved in a CSEM survey is produced by a dipole antenna (either an electric or magnetic dipole) located on or near the surface of the earth or seafloor, or in a borehole.

In most cases, the electromagnetic sensing is recorded deploying a plurality of electromagnetic sensors distributed on the surface of the earth or seafloor, or in a borehole. A preferred arrangement is according to a regular grid, although the exact survey layout for both controlled source and natural source EM surveys is determined pre-survey based on modelling and sensitivity analysis.

Seismic surveys allow structures in the sub-surface that potentially could contain hydrocarbon to be identified. Careful analysis can sometimes allow the presence of hydrocarbon to be inferred, however the uncertainty in this can be large and it is often challenging to determine its saturation, and thus distinguish between commercial and non-commercial accumulations.

In contrast, EM methods measure sub-surface resistivity, which is extremely sensitive to the presence and saturation of fluids, particularly resistive hydrocarbon fluids, in the sub-surface. However, EM methods can also be ambiguous when analysed in isolation.

Firstly, EM methods result in an extremely low resolution image of sub-surface resistivity and hence properties. This can be improved by including seismically derived structural information in the analysis process.

Secondly, a measurement of high resistivity does not uniquely identify the presence of hydrocarbons. Many other geological features, for example tight sandstones, basalt, coals or carbonates, also have a high resistivity. It is not possible to link a measurement of resistivity uniquely to its geological cause when only a single data type is considered.

Such ambiguities can be greatly reduced (or in some cases eliminated) when seismic and EM data are analysed together. In order to do this, a sound rock physics framework, generally calibrated using well log data, is required. However, the integration of seismic and EM methods is not straightforward and must overcome a number of challenges:

Physics: Firstly, measurements made using very different physical processes (electric and elastic in the case of EM and seismic respectively) must be combined and linked to the underlying rock and fluid properties in a consistent fashion. This requires a rock physics framework to be either numerically derived or empirically calibrated at well locations. In both cases such models are subject to uncertainty, which in turn leads to uncertainty in the resulting interpretation.

Sensitivity: Secondly, in order for an integrated interpretation approach to be successful, both seismic and EM methods must be sensitive to the interval of interest and changes in properties within it. Although this is perhaps an obvious statement, it is however a key consideration in determining where such approaches can be applied, and the optimum workflow to use. Sensitivity is in general extremely model dependent, and so this must be assessed, and workflows modified accordingly, on a case-by-case basis.

Scale: Finally seismic, EM and well log techniques sample the earth at very different scales, varying from a few cm in the case of well logs, to hundreds of metres for EM. These different scales must be reconciled in an integrated interpretation or joint inversion approach. This can prove one of the most challenging aspects of multi-physics analysis.

A number of approaches have been developed to address these problems, specifically the very different scales of the seismic model and the EM model. Most of the approaches disclosed in the prior art address this problem either by jointly inverting seismic survey data and EM survey data, or by inverting these data types separately and then integrating the resulting electric acoustic and/or elastic attributes. However the differing resolution scales of seismic and EM survey data are hard to reconcile in these approaches.

It is the purpose of the present invention to overcome these challenges using a novel approach to the joint inversion of acoustic and/or elastic attributes derived from seismic data, and EM data responses while maintaining the high resolution of a seismic model.

DESCRIPTION OF THE INVENTION

The present invention is a computer implemented method for analysing a seismic survey dataset and an electromagnetic survey dataset to generate a sub-surface rock and/or fluid model of a specified domain, said method comprising:
a) generating an acoustic and/or elastic model of the sub-surface domain dependent on a seismic survey data;
b) generating a rock and/or fluid model populated with rock and/or fluid properties dependent on the elastic model or on the acoustic model and, wherein the rock and/or fluid model is at the resolution of the acoustic model or the elastic model.

The acoustic or elastic model of the sub-surface domain is generated for a pre-specified domain being previously seismically explored by retrieving or recording the seismic survey data. This seismic survey data can be migrated to produce an image of the sub-surface. The migrated data can be further inverted to determine an elastic property at each point of the domain according to a pre-specified resolution, being the resolution allowed by a seismic survey, which is high when compared to the resolution allowed by an EM survey. The domain definition and the acoustic and/or elastic attributes are the minimum information of an acoustic and/or elastic model. A predetermined seismic migration method, for instance a Kirchhoff integral method, allows the data to be migrated. The migrated data can then be inverted (either pre-stack or post-stack) using any of the well-known methods currently available to generate said acoustic and/or elastic model of the sub-surface. The acoustic and/or elastic model may comprise one or many acoustic or elastic attributes. Examples of such properties include the P-impedance, the S-impedance, density, Poisson's ratio, lambda-rho, mu-rho or any combination thereof.

Once the acoustic and/or elastic model has been generated, the method does not need to generate again such model.

A model at the same scale as the acoustic and/or elastic model is then populated with rock and/or fluid properties dependent on the elastic model or on the acoustic model, resulting in a rock and/or fluid model at the resolution of the acoustic model or the elastic model. The rock and/or fluid model comprises at least one rock or fluid property. Examples of such properties are porosity, clay content or saturation.

These properties, the acoustic and/or elastic properties and rock and/or fluid properties, may be represented by models wherein the voxels/pixels of the model represent the acoustic/elastic attribute or rock/fluid property. A model may also be constructed comprising a plurality of layers in which each layer represents the acoustic/elastic attribute or rock/fluid property. Each voxel, pixel or layer of the model may contain a plurality of values to completely describe the acoustic/elastic model or rock/fluid model.

This first generated rock and/or fluid model comprises rock and/or fluid properties that are compatible with the seismic data but may not be correct as many properties are not uniquely determined by the seismic survey data alone.

The method additionally comprises the following steps:
c) iteratively, carrying out the following steps:
   determining a misfit according to:
   i. determining the acoustic or elastic response of the rock and/or fluid model and, determining a first misfit between said acoustic or elastic response and the acoustic and/or elastic model or,
   ii. determining the electric properties of the rock and/or fluid model where these electric properties are at the scale of the acoustic or elastic model and, further determining the electromagnetic response of the rock and/or fluid model according to the electric properties under a simulation of electromagnetic response corresponding to the electromagnetic survey dataset and, determining a second misfit between said electromagnetic response and the electromagnetic survey data or,
   iii. determining both, the first misfit and the second misfit according to step i) and step ii) respectively;
   updating the properties of the rock and/or fluid model;
   wherein step ii) or iii) is executed at least once, until the first misfit, if determined, is under a first predetermined value and the second misfit, if determined, is under a second predetermined value;
d) making the rock and/or fluid model available.

The iterative method c) based on the combination of steps i), ii) or iii) allows the information provided by the seismic survey data, by means of the generated acoustic and/or elastic model, and the information provided by the electromagnetic survey data to be combined in such a manner that the resolution of the seismic model is maintained in the process, leading to a seismic scale model of rock and fluid properties, conditioned by the electromagnetic survey data without the need to correlate properties between a low resolution model of electrical properties derived from an EM survey and a higher resolution image of acoustic and/or elastic properties derived from seismic survey data, as the prior art teaches for instance by interpolating a low resolution model into a high resolution model allowing the rock and fluid property model to be updated.

The method involves determining the acoustic or elastic response of the rock and/or fluid model for instance by statistical correlations between one or more acoustic and/or elastic and the rock and fluid properties of interest determined from well log data, or by a numerical simulation based on well-known rock physics models (for example the soft sand mode, the stiff sand model or hybrid models). The acoustic or elastic response of the rock and fluid model will match with the acoustic or elastic model after convergence.

This acoustic and/or elastic response of the rock and/or fluid model allows a first misfit between the acoustic and/or elastic response and the acoustic and/or elastic model being determined from the seismic survey data to be determined. If the seismic model comprises an acoustic model then the first misfit is computed by comparing the acoustic response and said acoustic model. If the seismic model comprises an elastic model then the first misfit is computed by comparing the elastic response and said elastic model.

A first threshold value is determined such that if the first misfit is under said threshold value the rock and fluid properties used for populating the rock and/or fluid model is deemed to be according to the seismic survey data.

The method also involves determining the EM response of the rock and/or fluid model, for instance by calculating electrical attributes (for example anisotropic resistivity) from the rock and fluid model for instance using statistical correlations between the electrical properties and the rock and fluid properties of interest based on well log data, or by numerical simulation based on well-known rock physics models (for example Archie, Simandoux or the Indonesia equation). A numerical simulation based on these electrical properties according to an electromagnetic source reproducing the electromagnetic fields of the electromagnetic survey is then undertaken. According to the invention, electrical properties are calculated from the rock and/or fluid model and used in the simulation, said electrical properties, like the rock/fluid properties, being populated at the scale of the acoustic or elastic model.

This electromagnetic response of the electric model under a simulation of a EM electromagnetic survey provides electromagnetic values obtained at the location of the electromagnetic sensors of the electromagnetic survey. These values may be compatible with the values provided by the sensors of the EM electromagnetic survey.

The simulation of the EM electromagnetic survey data comprising the electromagnetic excitation, the typology of the sensors and the arrangement of said sensors is carried out over the rock and/or fluid model wherein the acoustic and/or elastic, and the electrical or electromagnetic properties are at the seismic resolution. The response at the sensors is compared with the electromagnetic survey data determining a second misfit between said electromagnetic response and the electromagnetic survey data.

A second threshold value is determined such that if the second misfit is under said threshold value the rock and fluid properties used for populating the rock and/or fluid model is deemed to be according to the EM electromagnetic survey data.

Some embodiments of the method propose different strategies combining the order of executing step i), ii) or step iii) computing both misfits, the first misfit and the second misfit, and the resulting convergence for some relevant variables will be disclosed when disclosing detailed embodiments of the invention.

Specifically, step c) allows iteration first using only step i) reducing the first misfit associated to the seismic data and then iterating only step ii) reducing the second misfit associated to the CSEM electromagnetic survey data.

The invention requires that the information of the EM electromagnetic survey data is used at least once converging to a rock and/or fluid model having rock and/or fluid properties compatible with the acoustic/elastic model derived from the seismic survey data and compatible with the response of the CSEM electromagnetic survey data.

After determining the first misfit, the second misfit or both, the method updates the properties of the rock and/or fluid model keeping the resolution at the resolution of the acoustic model and/or the elastic model for both kind of properties, rock and fluid properties and electric or electromagnetic properties.

The update process may involve a known inversion process. Some examples of methods for updating properties may use a standard gradient inversion algorithm, a non-linear conjugate gradient algorithm, and Bayesian update, a genetic algorithm approach, a multi-chain monte carlo (MCMC) method, a Nelder Mead method or a Levenberg Marquardt method, enumerated only as mere examples.

After convergence, step f) makes the result available.

DESCRIPTION OF THE DRAWINGS

These and other features and advantages of the invention will be seen more clearly from the following detailed description of a preferred embodiment provided only by way of illustrative and non-limiting example in reference to the attached drawings.

DETAILED DESCRIPTION OF THE INVENTION

Figure 1:
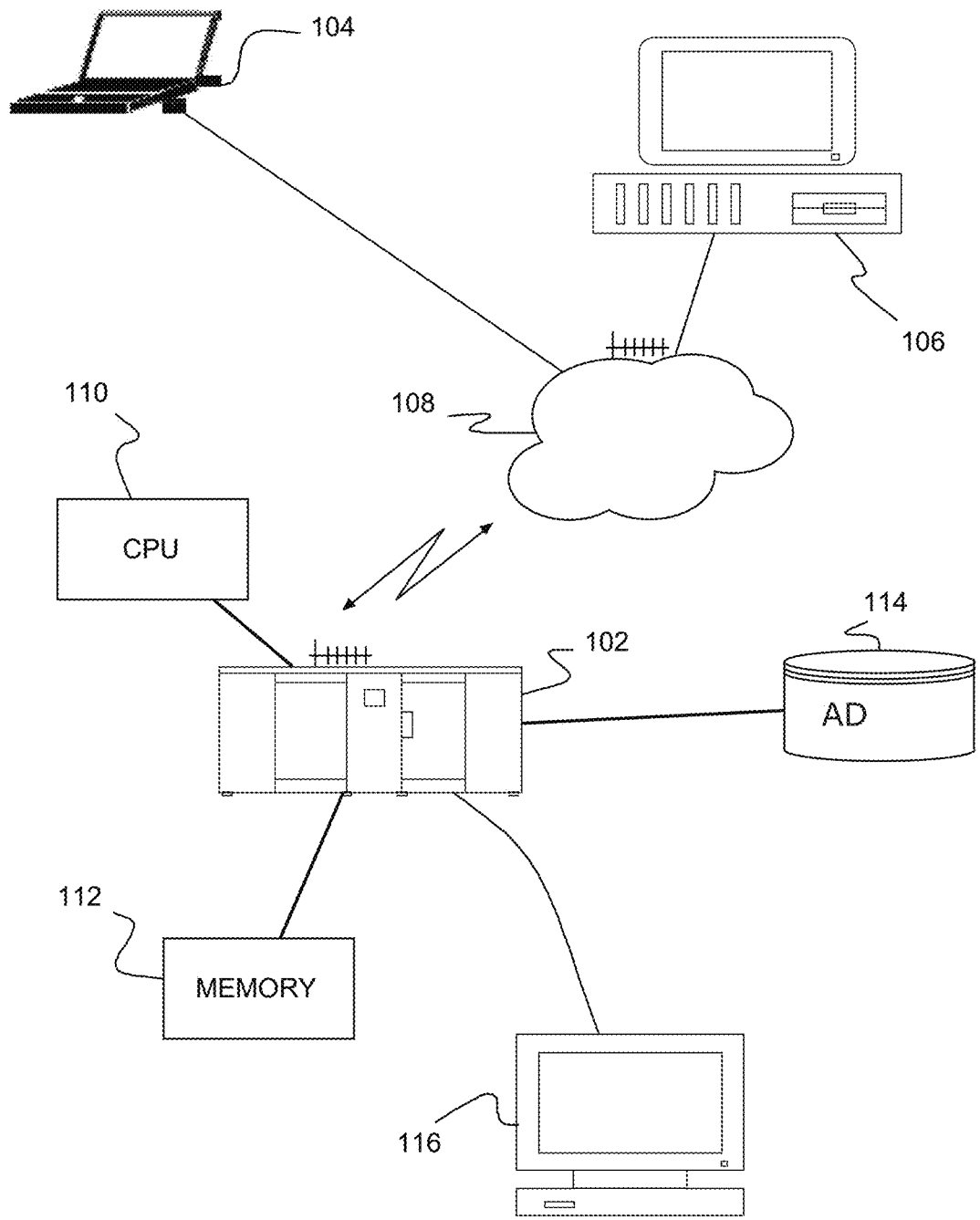
FIG. 1 This figure shows a data processing system for carrying out a method according to the invention.

As will be appreciated by one skilled in the art, aspects of the present invention may be embodied as a system, a method or a computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language, Fortran, or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to illustrations and/or diagrams of methods, apparatus (systems) and computer program products according to embodiments of the invention. It will be understood that each illustration can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Turning now to the drawings and more particularly, FIG. 1 shows an example of a system 100 for generating a subsurface rock and/or fluid model of a determined domain starting from acoustic field data (AD) comprising a model of acoustic attributes derived from seismic survey data, and EM electromagnetic data, both data collected from separate surveys in the same geographical area, according to a preferred embodiment of the present invention. The condition of being the two data collected from separate surveys in the same geographical area applies to all the embodiments.

A preferred computing system 100 includes one or more computers 102, 104, 106 (3 in this example), coupled together, e.g., wired or wirelessly over a network 108. The network 108 may be, for example, a local area network (LAN), the Internet, an intranet or a combination thereof. Typically, the computers 102, 104, 106 include one or more processors, e.g., central processing unit (CPU) 110, memory 112, local storage 114 and some form of input/output device 116 providing a user interface. The local storage 114 may store the acoustic data and the EM electromagnetic data being accessible by the plurality of computers 102, 104, 106, processing in parallel a plurality of individual rock and fluid models, each individual process being processed by each computer 102, 104, 106, in such a manner that the combination of the plurality of individual rock and fluid models provides an estimation of the uncertainty as it will be disclosed in an specific embodiment.

The present invention provides a method for generating a subsurface rock and/or fluid model of a determined domain. In this embodiment the domain is located under the surface of the seabed and the method starts from data retrieved from two surveys:

a first seismic survey carried out by using vibrators, airguns or another acoustic source and acoustic sensors such as geophones or hydrophones distributed over the seabed or in the water column above it and, a second CSEM electromagnetic survey carried out by using a plurality of electromagnetic sensors, in this specific embodiment distributed according to a regular grid, over the surface of a seabed for reading the electromagnetic field generated by a horizontal electric dipole antenna that is flown over the seabed at a height of in general 30-50 m; wherein the electromagnetic field deployed by the antenna is chosen based on the estimated rock and fluid structure located below the seabed, and is recorded by the seafloor sensors.

Figure 2:
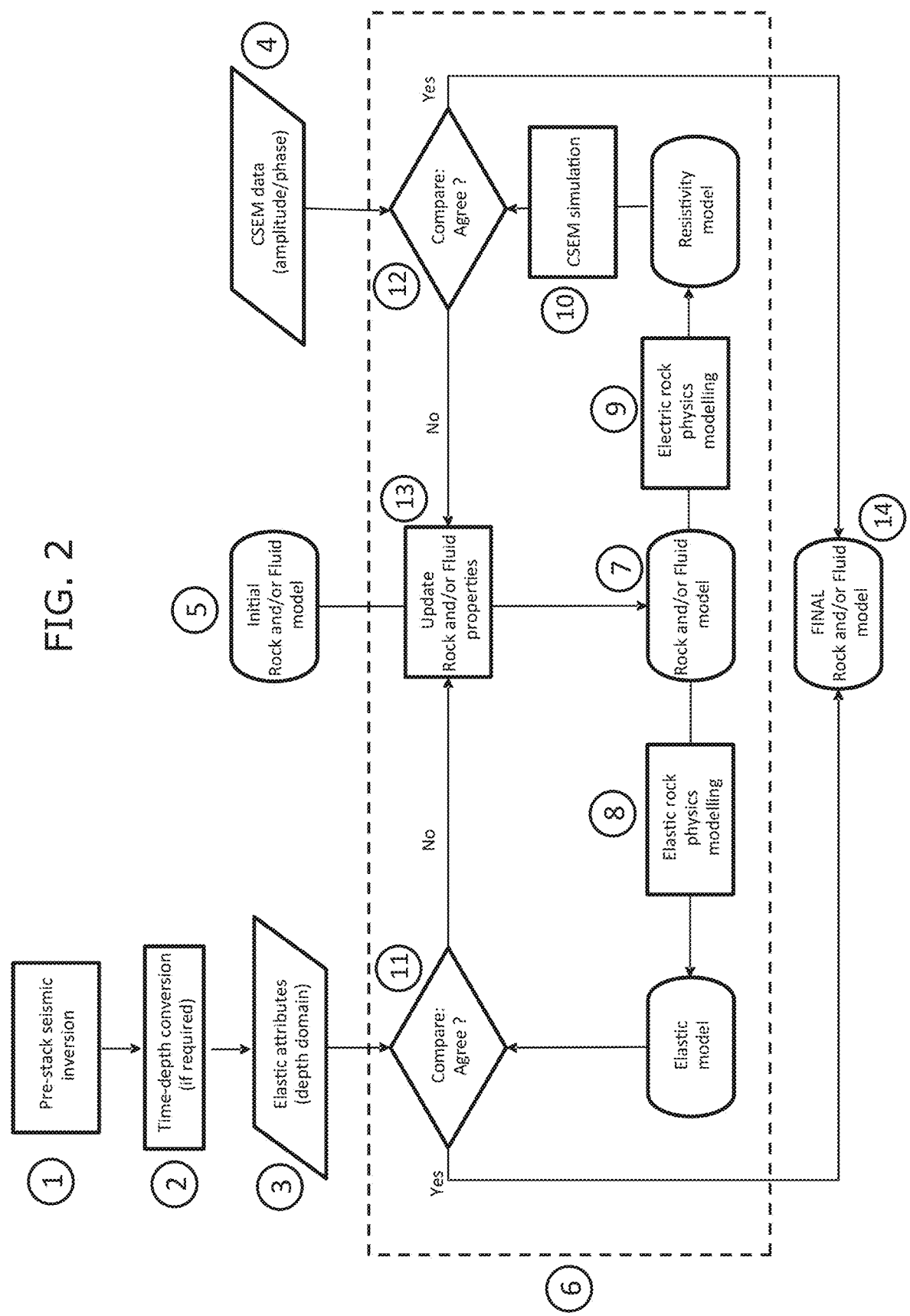
FIG. 2 This figure shows a schematic representation of the method according to a first embodiment of the invention.

FIG. 2 gives an overview of the proposed method. Serial numbers in brackets will identify the steps represented in figures with the same number in a circle; that is, these number are not reference numbers to elements, they just indicate the order of execution of the steps of the method.

Seismic data collected from the seismic survey are first inverted using one of the many well-known methods available (1). Preferably pre-stack data are used so that elastic attributes (P-impedance and S-impedance and derived attributes) are calculated. Post-stack data could be used for the inversion, yielding only acoustic properties or attributes. In this embodiment, the data are then converted from time to depth, again using well known algorithms (2). The result is an elastic model comprising a model with elastic properties or attributes, defined in depth, at seismic resolution, to be used as input to the proposed method (3).

The second input to the proposed workflow in this embodiment is processed frequency domain CSEM electromagnetic data collected from the CSEM electromagnetic survey, comprising, in this embodiment, amplitude and phase of the electric and (in some cases) magnetic field, as a function of source-receiver separation, geometry and signal frequency (4). This could be obtained from deep-towed nodal CSEM methods, towed streamer CSEM methods or one of the other CSEM acquisition methods that are well known. Although in this embodiment, frequency domain data are employed, the method could equally be applied to time domain data, in which case the CSEM survey data would comprise decay curves of the electric or magnetic field with time measured at each of the sensors. Similarly the method could be applied to natural source data collected offshore, or to natural source or CSEM data collected onshore or in a borehole.

The next input to the proposed iterative method is a starting rock and/or fluid model, in this embodiment comprising lithology and fluid properties (for example porosity, clay content and water saturation, $S_w$) and seismically defined facies (5).

The rock and/or fluid model could be a 1D depth profile, a 2D section or a 3D volume. This rock and/or fluid model can be derived from seismic quantitative interpretation processes such as the multi-attribute rotation scheme (MARS), statistical rock physics approaches, or petrophysical inversion of elastic properties only, or other known approaches for seismic quantitative interpretation.

The core of the iterative method is depicted in the dashed box and labelled as (6) in FIG. 1, which represents the joint inversion of seismically derived elastic attributes, and CSEM amplitude and phase data according to the invention. A number of embodiments of this inversion will also be disclosed.

In a first embodiment, shown in FIG. 2, the rock and fluid model (7) comprising (for example) porosity, $V_{clay}$ (clay content) and $S_w$ (water saturation) is used to calculate the equivalent geophysical properties. This is done using rock physics relationships that link the rock and fluid properties of the rock and fluid model to elastic properties or attributes (P-velocity and S-velocity, density, and impedance) (8) of the elastic model and also electric properties of the rock and fluid model (anisotropic resistivity) (9).

Populating the rock and fluid model with rock and fluid properties may be done by using deterministic relationships, such as the soft sand or stiff sand correlations (for the elastic case) and Archie's equation or the Simandoux equation for the electric case.

The correlation providing the relationships used should be calibrated to well log data. Alternatively, the rock physics models could be statistical relationships between rock and fluid properties and geophysical attributes, again based on well log data.

Preferably the rock physics relationships should account for electric and elastic anisotropy in the sub-surface.

Rock physics correlations according to another embodiment may also be facies dependent and therefore variable within the well, section or volume under study, according to the seismically defined facies that are observed.

On the electrical side, the resistivity properties derived are then used to calculate the equivalent CSEM amplitude and phase response through a process of forward modelling of the 1D, 2D or 3D resistivity model that has been derived (10). Forward modelling algorithms to accomplish this task are well-known.

In step (11) the elastic properties derived from the rock and/or fluid model are compared to the input data, the elastic model, and the misfit between the data and modelled attributes calculated.

Similarly the CSEM response from the rock and/or fluid model is compared to the input CSEM data (12) and the misfit between the two calculated.

If the misfit (either elastic or CSEM or a combination of the two) is higher than a user-defined level, the rock and/or fluid model is updated (13), and the process is repeated.

The iterative update and comparison is repeated until the misfit between the input data and that modelled from rock and/or fluid model is less than a user defined value, or the maximum number of iterations is reached. The result is a final rock and/or fluid model (14).

Several embodiments arise depending on the order of iteration over the seismic properties or the electromagnetic properties.

Figure 3:
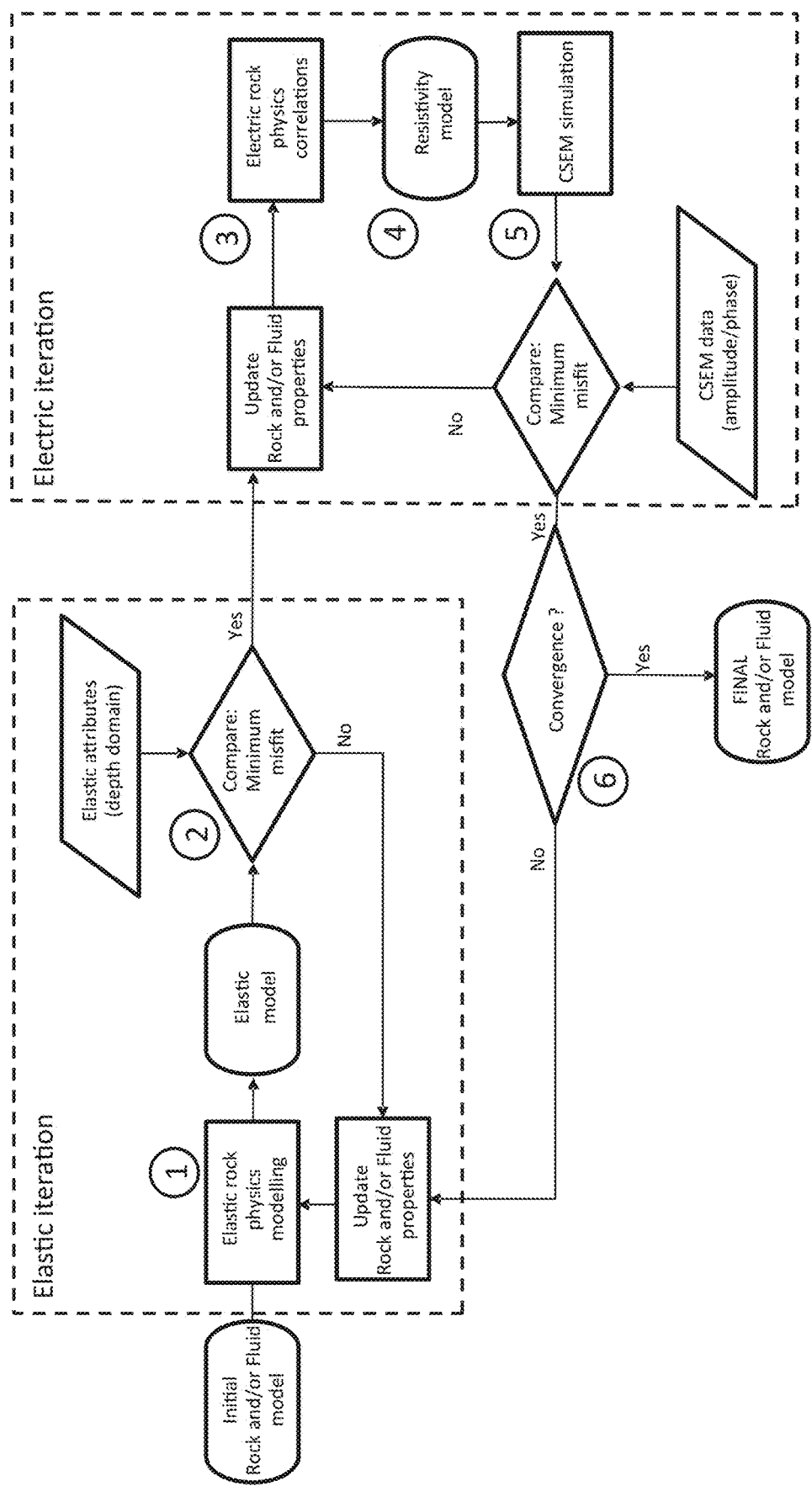
FIG. 3 This figure shows a second embodiment of the invention wherein the elastic iteration and the electric iteration is carried out separately.

In the second embodiment the inversion process identified within the dashed line as (6) in FIG. 3 is run using a cascade approach in which the elastic and electric processes are run sequentially rather than simultaneously within the general iterative loop. This is illustrated in FIG. 3 wherein now numbers start again from 1.

As in the first embodiment, the input to the inversion process is elastic attributes in depth stored in an elastic model derived from the inversion of seismic data and, processed CSEM amplitude and phase data.

In the first elastic iteration, starting from an initial rock and/or fluid model already populated with a first proposal of properties, elastic properties are calculated using elastic rock physics correlations or deterministic rock physics models as above (1), and said calculate properties compared with the elastic model. If the calculated misfit is high, the rock and/or fluid model is updated, and the comparison repeated, until a minimum misfit between the elastic properties calculated from the rock and/or fluid model and the elastic model obtained from the survey data.

According to a specific example, the rock and fluid properties which are updated could be solely those that are best constrained by seismic data (for example porosity and clay content) or preferably comprises the complete set to be determined by the cascade inversion (for example porosity, clay content, $V_{clay}$ and water saturation, $S_w$).

Once a rock and fluid model that minimised the misfit to the elastic data has been found, this rock and fluid model is passed to the electric iterative component of the method, the electric iterative loop.

Electric rock physics correlations or deterministic rock physics models (3) are used to calculate a resistivity model (which is anisotropic in this embodiment) (4), from which synthetic CSEM data are calculated using a forward modelling approach (5). These data are compared to the input CSEM amplitude and phase data. The rock and/or fluid model is then iteratively updated until a model that minimises the misfit between the CSEM modelled and measured data is found. As in the electric iteration, the update to rock and/or fluid properties could include all properties of interest, or be confined to those to which the CSEM data are primarily sensitive (for example water saturation).

At the end of each elastic and electric iteration pair, the workflow is assessed for convergence (6).

The convergence criterion could be based on the combined electric and elastic misfit falling below a user defined level, the change in the misfit between successive electric/elastic pass pairs falling below a user defined level, or a user defined maximum number of iterations being exceeded.

Figure 4A:
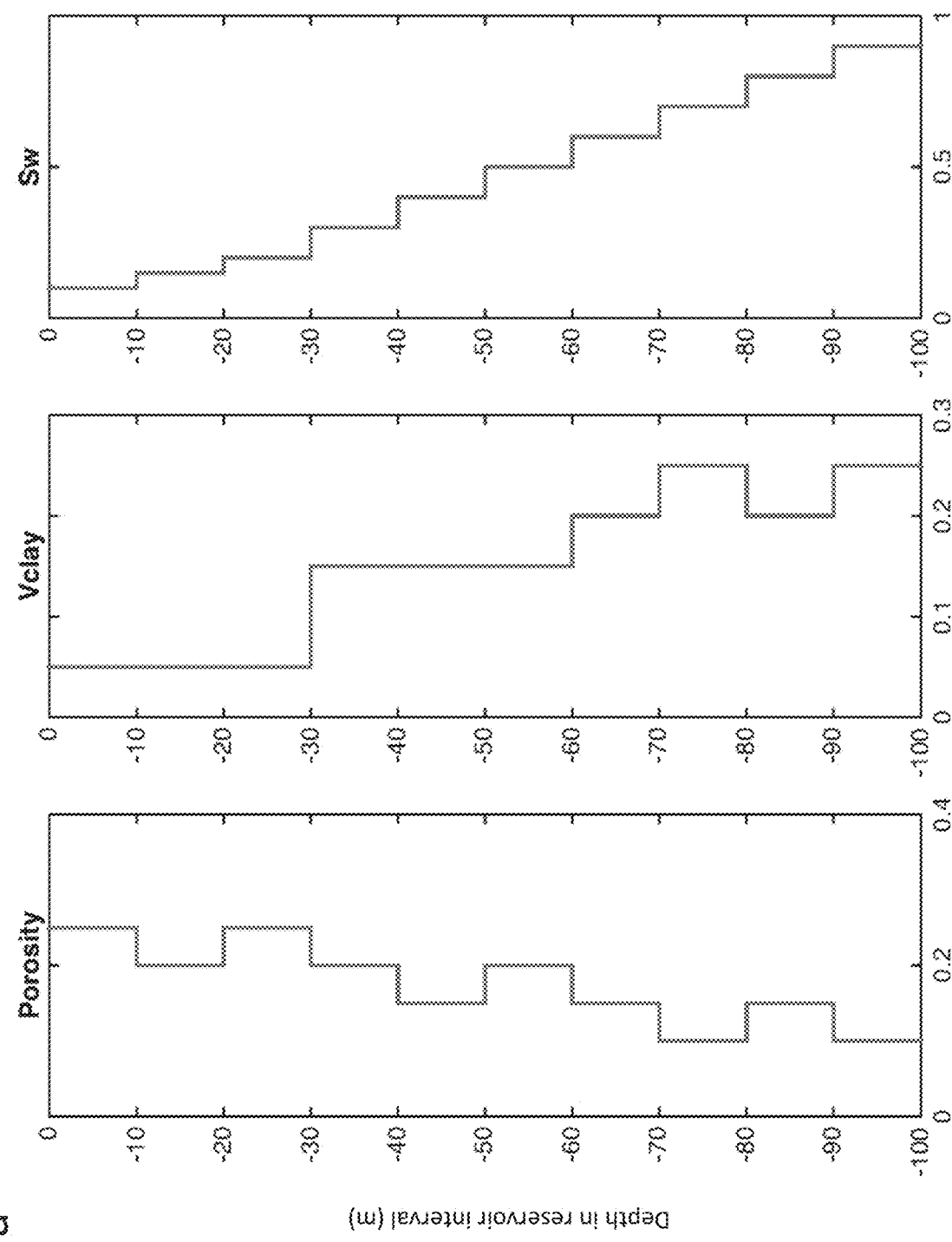
FIG. 4a These figures show a plurality of rock and fluid properties of a simple 1D rock and fluid model as an example of the second embodiment.
Figure 4B:
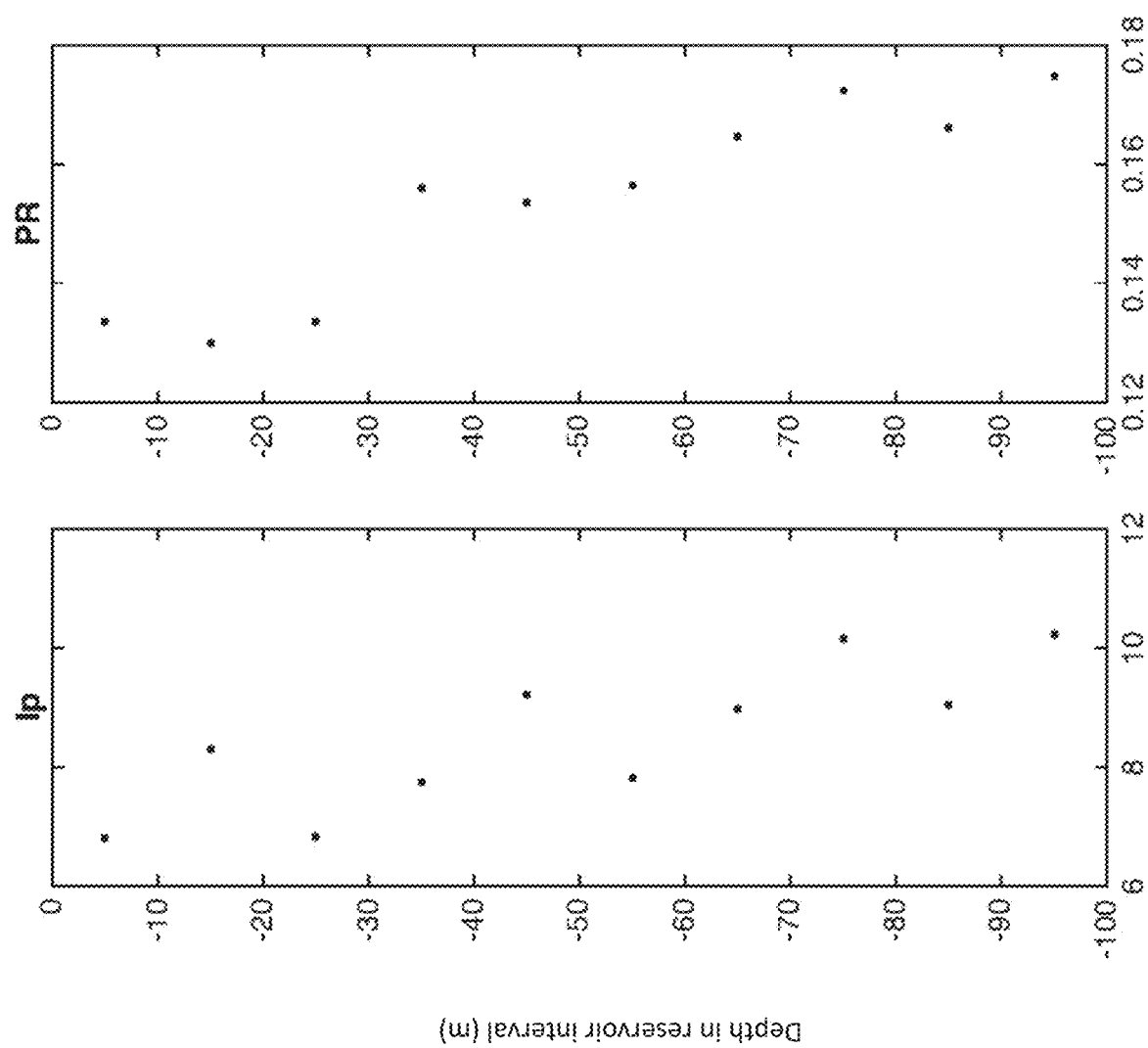
FIG. 4b These figures show a plurality of acoustic properties (Acoustic impedance, Ip) and elastic properties (Poisson's ratio, PR) in a simple 1D model as an example of the second embodiment.
Figure 5B:
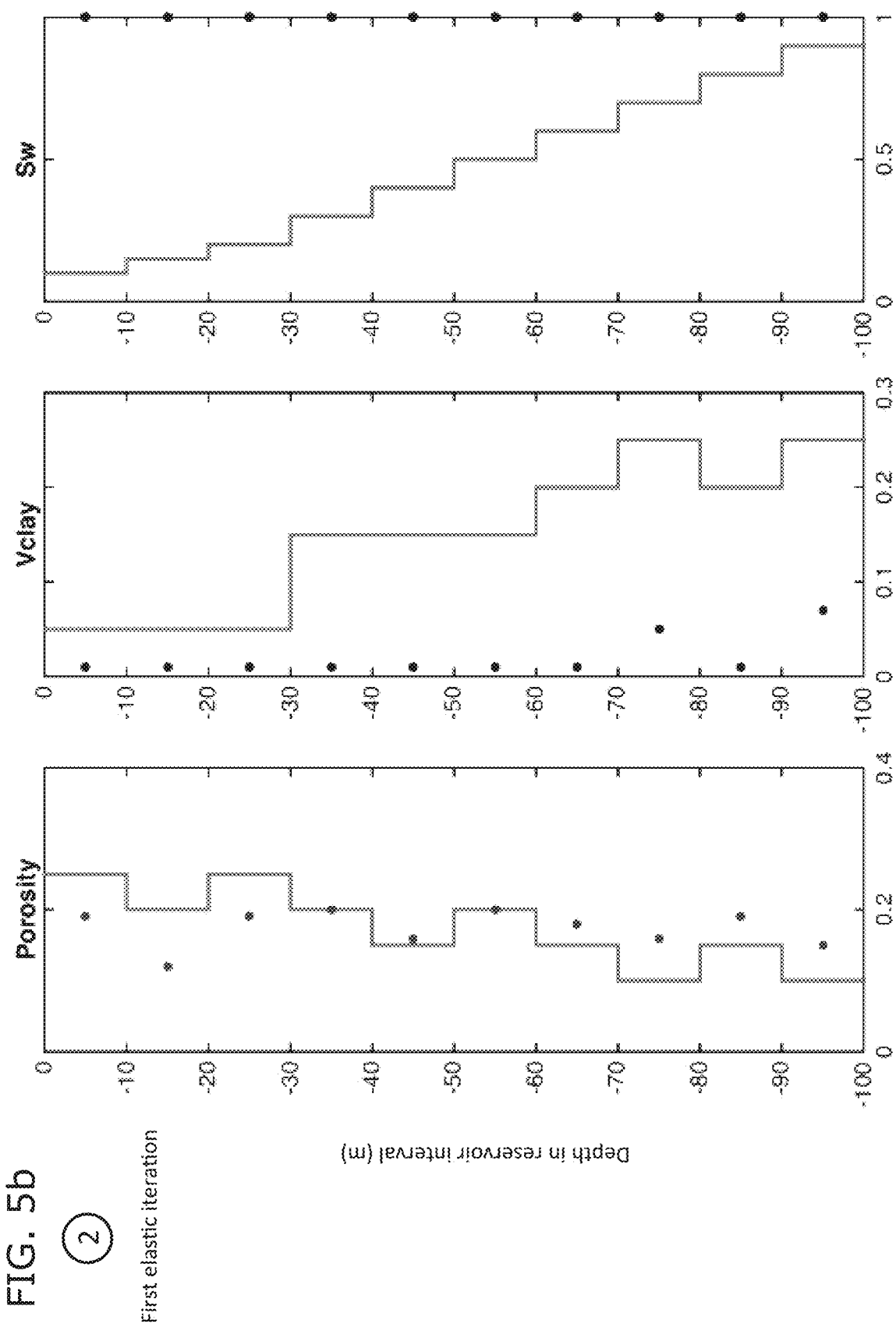
FIGS. 5a-5d These figures show the evolution of the porosity, clay content and water saturation of the 1D example of FIGS. 4a and 4b according to the iterative process according to the second embodiment.
Figure 5C:
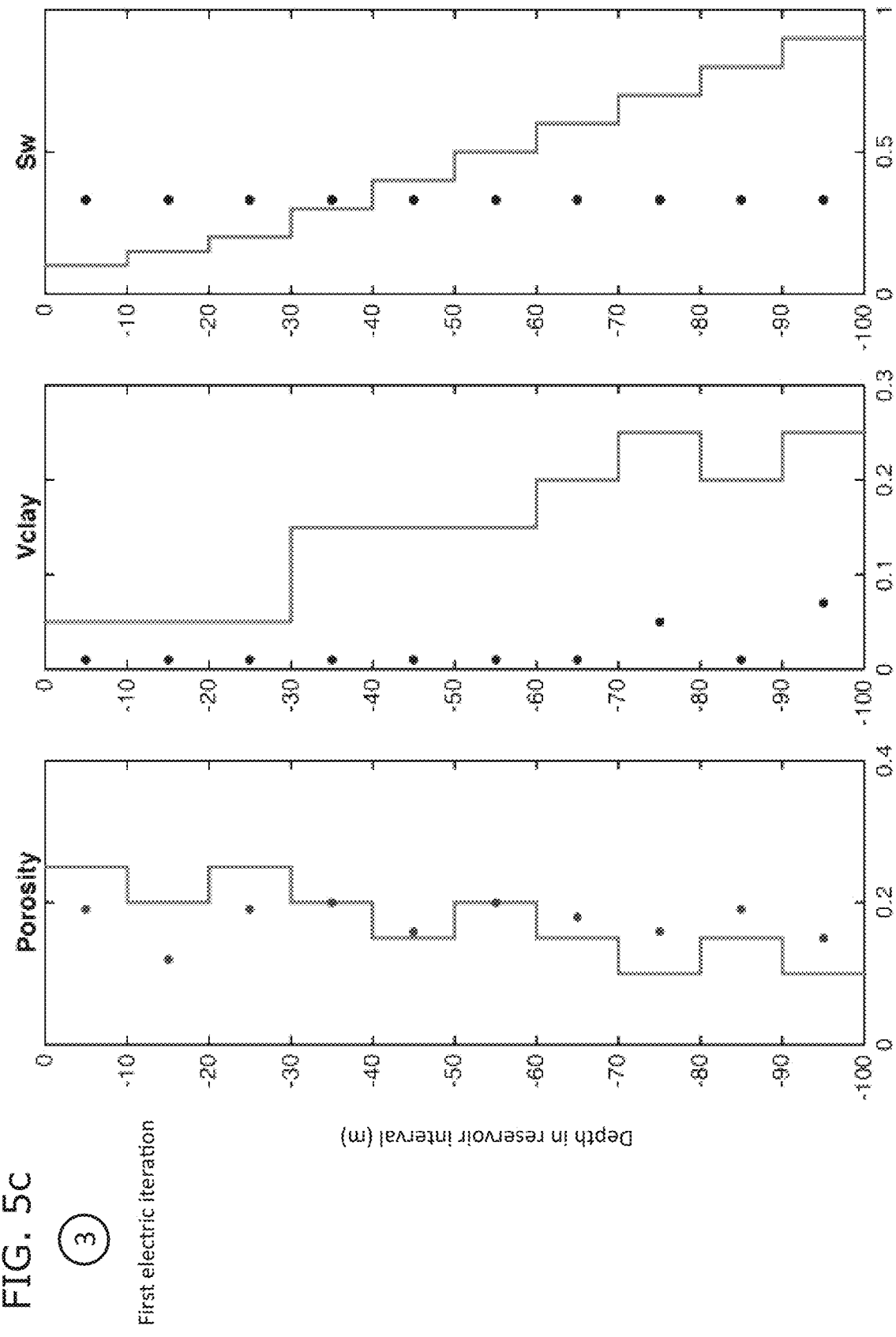
Figure 5D:
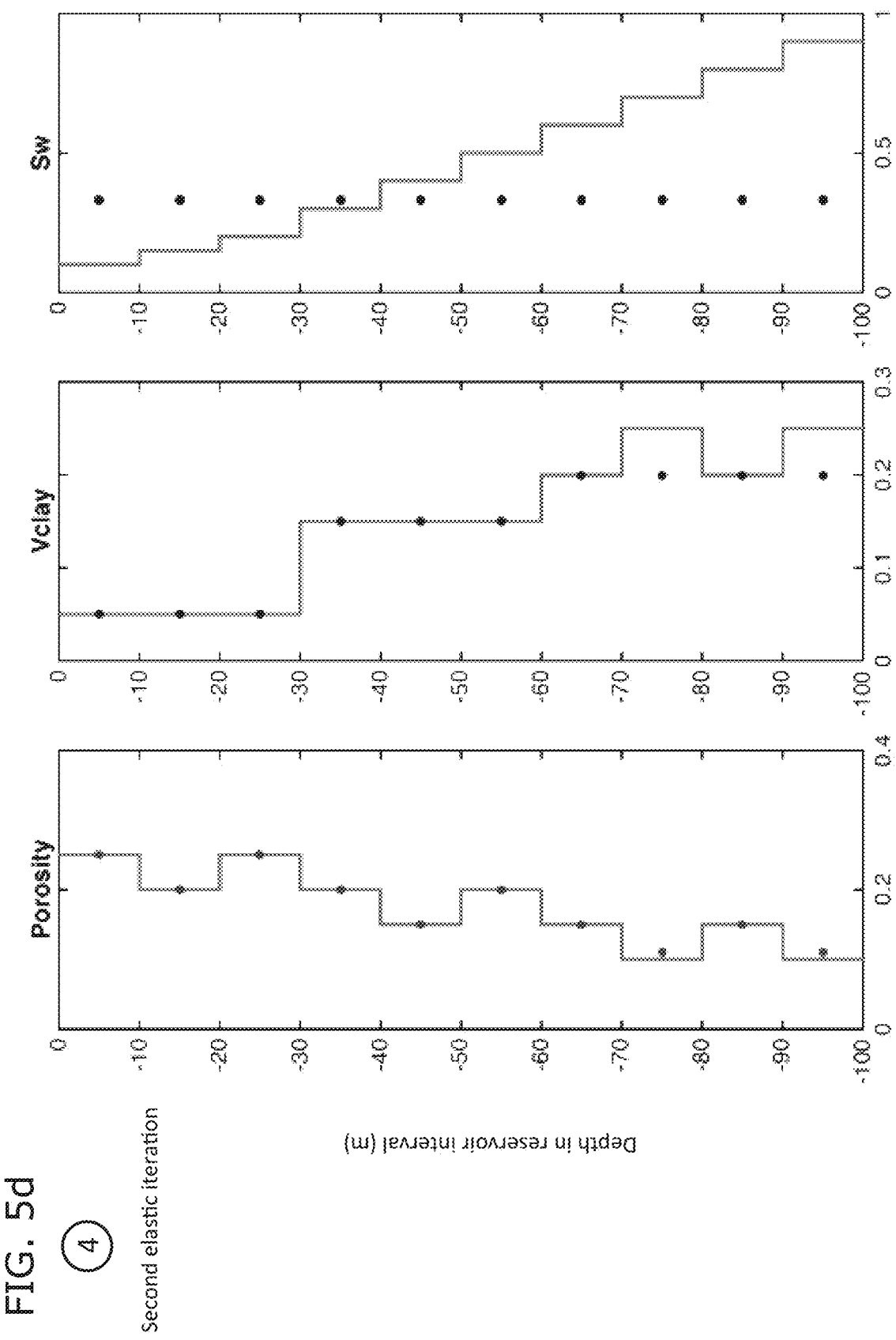
Figure 5E:
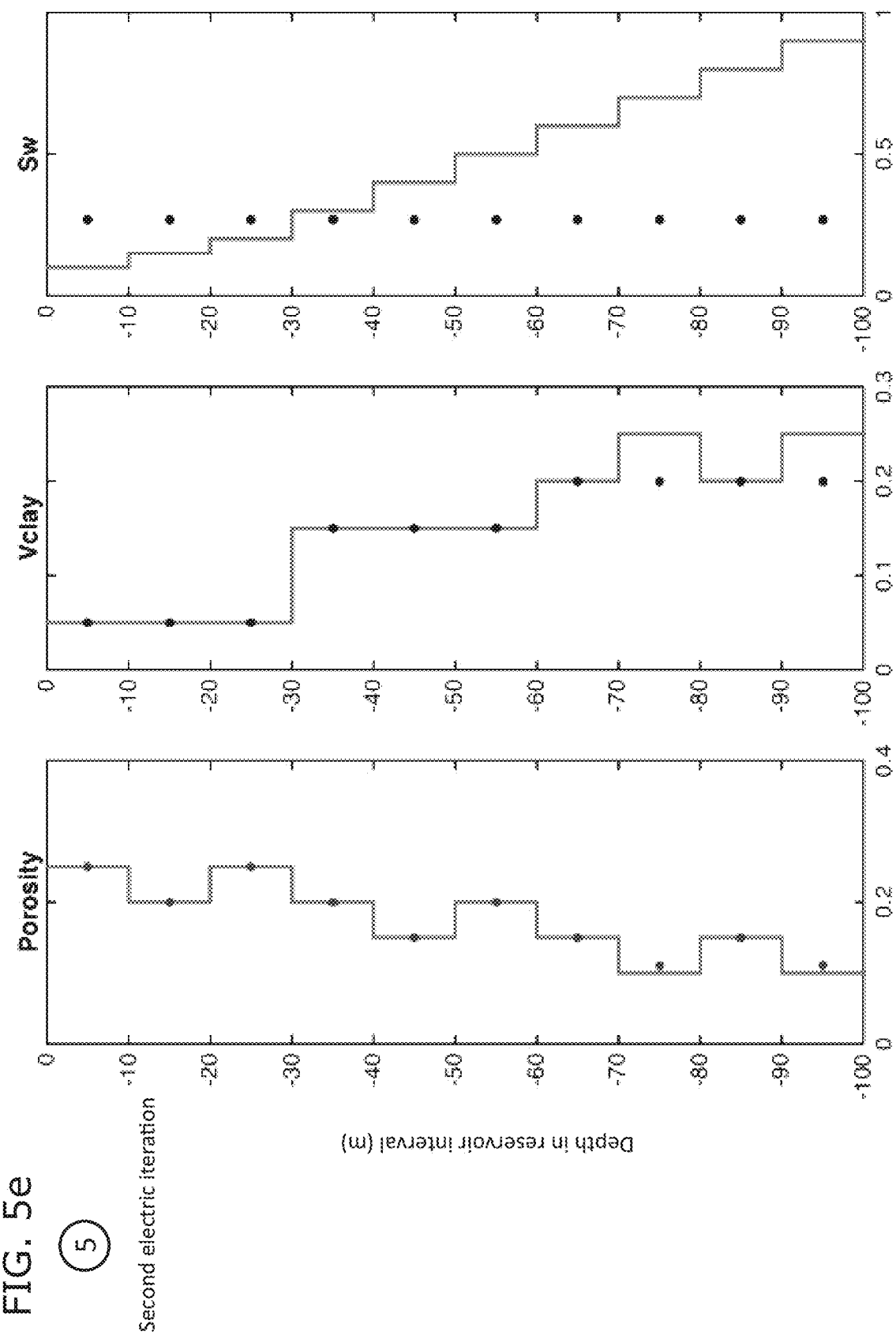

FIGS. 4 (comprising FIGS. 4a and 4b) to 6 show an illustration according a specific case of the second embodiment.

FIG. 4a shows a simple 1D model of porosity, clay content and water saturation ($S_w$) wherein the value of each variable is represented in the abscissa axis and depth coordinate is represented in ordinate axis.

From this synthetic elastic properties and CSEM data were generated. The elastic properties were generated using the stiff sand model and Gassman fluid substitution, a well-known rock physics approach (for instance disclosed in "The Hand book of Rock Physics" by Mavko et al.) linking elastic properties to the underlying rock and fluid properties. The resulting acoustic impedance and Poisson's ratio for the starting model are shown in FIG. 4b.

In this example P-impedance (Ip) and Poisson's ratio (PR) were considered. Parameters in the stiff sand model were as follows: Pressure=1.0, critical porosity=0.4, coordination number=8, bulk modulus of brine, $K_{brine}$=2.29, density of brine=1.0, density of hydrocarbon=0.065.

Similarly the well-known Simandoux relationship (with parameters a=1.0, m=1.7, n=1.7, resistivity of clay, $R_{clay}$=5.0 and resistivity of interstitial water, $R_w$=0.18) was used to calculate the resistivity of the reservoir interval:

$$\frac{1}{R} = \frac{\phi_e S_w^n}{aR_w} + \frac{V_{clay} S_w}{R_{clay}}$$

where R is the effective resistivity of the medium, $\phi_e$ is the effective porosity defined as $\phi_{total}(1-V_{clay})$ being $\phi_{total}$ the total porosity, $V_{clay}$ is the clay content, and $S_w$ is the water saturation.

This model of reservoir properties was embedded in a simple 1D anisotropic background and from the resulting model the CSEM amplitude and phase response was calculated using a 1D forward modelling approach.

A small amount of noise has been added to the data for the test. The CSEM amplitude and phase data, and the elastic properties calculated in this way form the input to the workflow proposed here.

FIG. 5 shows the cascade approach to the joint inversion. In this example four iterations were undertaken: two electric iterations identified as step ii) in the invention and two elastic iterations identified as step i) in the invention.

In each panel of FIG. 5 the solid black line is the true rock and fluid model (the solution of the problem that should be approximated after convergence of the method), and the dots represent the current rock and fluid model at each stage of the inversion cascade. Porosity and $V_{clay}$ are assumed constant in the reservoir interval in the starting rock and fluid model (1), and the reservoir is assumed water wet. Again, numbers just identify the sequence of steps.

The first iteration is an elastic iteration (2), and for the example shown only porosity and $V_{clay}$ are updated in this step.

A rock and fluid model is found which minimises the misfit between the modelled P-impedance and Poisson's ratio, and the input synthetic data calculated by simulating the response of the domain using a global search approach. Although the rock and fluid model is updated, it is still not close to the true rock and fluid model.

The second iteration is an electric iteration (3), and in this example only $S_w$ (water saturation) is updated in this iteration.

A rock and fluid model is found which minimises the difference between the modelled CSEM amplitude and phase data and the input synthetic amplitude and phase obtained by simulating the response of the domain when being excited with the dipole antenna, again using a global search approach. The updated $S_w$ is now less than 1 (water wet), indicating the presence of hydrocarbons in the reservoir.

The third iteration is again an elastic iteration, and at this step, with the updated $S_w$ closer to reality, we find porosity and $V_{clay}$, which are varied in this step, are now much closer to their true values.

The fourth iteration is again an electric iteration (4), and this step again updates only the $S_w$ property, refining the value so that is now very close to the average value of the true $S_w$ in the reservoir.

Figure 6:
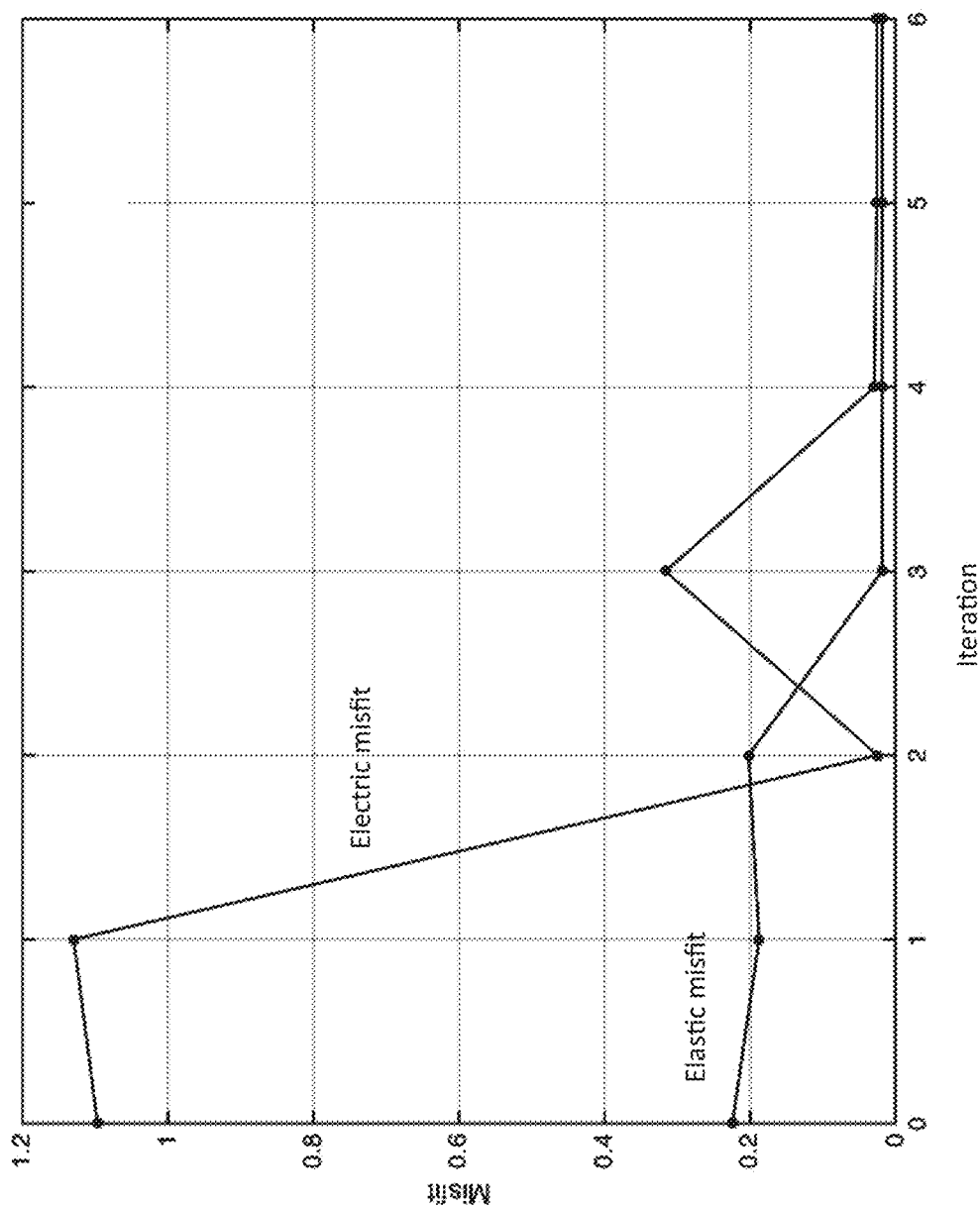
FIG. 6 This figure shows the evolution of the first misfit (or elastic misfit) and the second misfit (or electric misfit) for the sequence of iterations.

FIG. 6 shows the evolution of the misfit of the elastic properties and CSEM properties throughout the iterative process until convergence. This shows 6 iterations of the inversion described above, and it is clear that by iteration 4 the inversion has converged and there is little further change to the rock and fluid model. The final rock and fluid model accurately recovers porosity, $V_{clay}$ and the average water saturation in the reservoir interval.

Figure 7A:
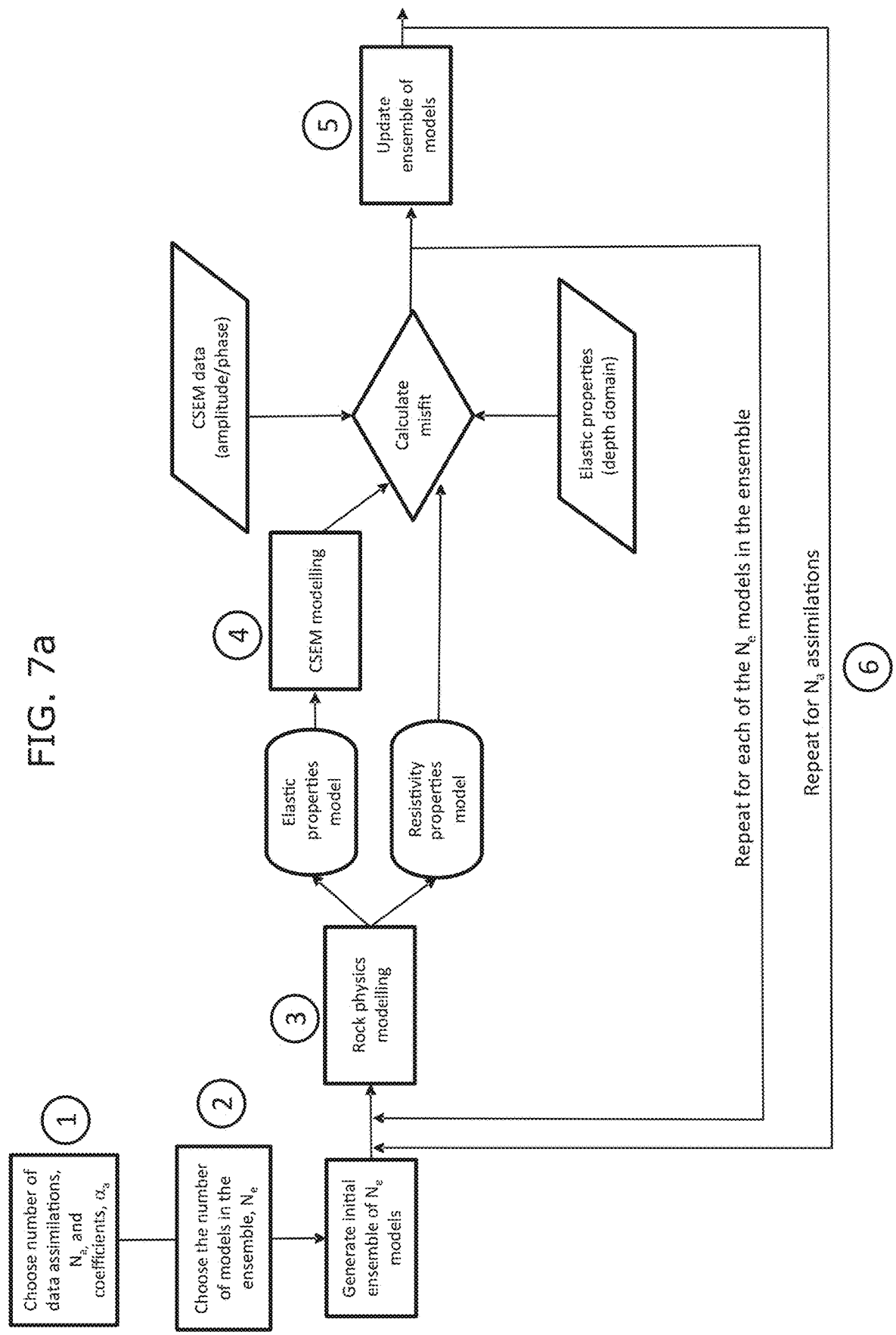
FIGS. 7a,7b These figures show a schematic of a third embodiment of the invention wherein the joint inversion of the rock and fluid properties (lithology of the rock and facies) and the electromagnetic survey data is undertaken using an ensemble method representing statistically the rock and fluid model by means of a plurality of individual rock and fluid models.

In the third embodiment the joint inversion is undertaken using an ensemble based method for the joint inversion of the electromagnetic data and seismic properties according to the invention to estimate rock and fluid properties, for example porosity, lithology, and saturation. The method according to this embodiment is illustrated in FIG. 7a which ends at FIG. 7b.

Steps a) and b) are commonly carried out by any disclosed embodiment and therefore new embodiments emphasize the specific manner of generating the rock and/or fluid model and the steps iterating on it. In this specific case the rock and fluid model comprises a set of $N_e$ individual rock and fluid models $m_j$, j=1 . . . $N_e$ (rather than just one) described by the statistics of the rock and fluid properties in the domain.

As the rock and fluid model comprises a plurality of individual rock and fluid models each with different rock and fluid property attributes, each individual rock and fluid model $m_j$ is generated at the resolution of the acoustic model or the elastic model and falls within the range of possible rock and fluid properties consistent with the acoustic and/or elastic model. An initial set (the prior ensemble) of rock and fluid models are generated (in our case, models of porosity, lithology, and saturation) by populating the already generated acoustic or elastic model as in any of the previous embodiments providing individual rock and fluid models having different rock and fluid properties.

The iterative method also computes the physical response (in our case, the elastic and electromagnetic data according to steps i) and ii) respectively), and all the individual rock and fluid models are updated using a Bayesian updating approach by minimizing the mismatch between the measured data and predicted response.

The input data to the iterative loop is as in previous embodiments: the acoustic or elastic properties gathered in the acoustic or elastic model derived from seismic data, and processed CSEM amplitude and phase data obtained in the CSEM electromagnetic survey.

Figure 7B:
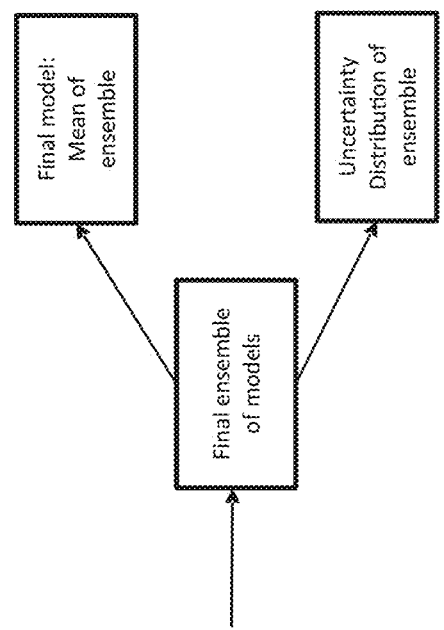

The method operates as follows with reference to FIGS. 7a and 7b wherein numbers in circles identify again the order of the steps:

1) If the inversion is performed assuming a small error in the populated data, the risk is that we force the rock and fluid model to match the data by assuming unreasonable values (the solution is a local minimum but does not have a physical meaning). If the rock and fluid model is updated assuming a large error in the data, the risk is that the initial models are not perturbed enough (the solution is close to the initial model but the data match is poor). Therefore the updating process is repeated several times (number of updates or assimilations, $N_a$, is typically between 4 and 8, and is chosen by the user in step (1)), starting with large errors, and reducing the error at each assimilation (5). Therefore the Bayesian updating is repeated $N_a$ times, as a stochastic optimization loop. The optimization is controlled by user defined parameters $\alpha_i$, which vary with assimilation, i, for i=1 . . . $N_a$ 2) An ensemble of initial realisations of the property or properties of interest is then generated (for example resistivity, porosity and/or saturation). The ensemble contains $N_e$ individual rock and fluid models (for example $N_e$=100) (2)

3) For each of these $N_e$ individual rock and fluid models electric and elastic rock physics models or correlations are used as previously described to compute resistivity and elastic properties (for example impedance) (3)

4) The resistivity computed from each individual rock and fluid model allows an electromagnetic simulation to generate CSEM amplitude and phase data (4).

5) Based on the misfit between the observed and the calculated elastic properties and CSEM electromagnetic data, a Bayesian update is performed for each individual rock and fluid model comprising the ensemble (5) [identified in a general form as the rock and fluid model]. The Bayesian update requires the covariance matrix of the data and the cross covariance matrix of the rock and fluid model and data. These matrices cannot be analytically computed because of the non-linearity of the physical model. Hence said matrices are approximated using the ensemble of the individual rock and fluid models. The individual rock and fluid model update is performed as follows:

a. For each individual rock and fluid model the vector of observed data is perturbed, as follows:

$$d_{uc} = d_{obs} + \sqrt{\alpha_i} C_D^{1/2} z_d \text{ where } z_d \sim N(0, I_{N_d})$$

wherein
- $d_{uc}$ is the updated vector of observed data,
- $d_{obs}$ the observed property, that is, the elastic/acoustic properties determined from the seismic survey data and the electromagnetic data observed in the CSEM electromagnetic survey data,
- $\alpha_i$ a number of perturbing updates being $\alpha_i \in [1, N_a]$ and,
- $C_D$ the covariance matrix,
- $z_d$ a sampled value of a Gaussian distribution.

and then b. The updates of all the individual rock and fluid models $m_j$ comprising the ensemble of models, is performed using the following relationship all the:

$$m_j^p := m_j^f + C_{MD}^f (C_{DD}^f + \alpha_i C_d)^{-1} (d_{uc,j} - d_j^f)$$

wherein
- ":=" denotes the updating process as an update from former values,
- the superscript "p" denotes the updated value of the property,
- the superscript "f" denotes the previous model value of the property,
- $C_{MD}^f$ is the cross covariance matrix between the prior vector of model parameters $m^f$ and the vector of predicted data $d^f$,
- $C_{DD}^f$ is the autocovariance matrix of predicted data,
- $\alpha_i$ a number of updates being $\alpha_i \in [1, N_a]$ with the constraint $\Sigma_{i=1}^{N_a} \alpha_i = 1$ and,
- $d_j^f$ is the predicted response from the m individual rock and fluid model,
- and $d_{uc}$ is as given above 6) Repeating steps 3-5 for each of the $N_a$ assimilation steps (6).

7) The final predicted rock and fluid model is the average of the updated individual rock and fluid models in the final ensemble. The uncertainty in the result is also obtained from the distribution of individual rock and fluid models in the final ensemble.

The advantage of this approach compared to more conventional stochastic optimisation methods (for example Markov chain Monte Carlo (McMC) methods, which have been employed for CSEM inversion by e.g. Buland & Kolbjornsen (2012)) is its relative computational efficiency.

The computational cost of McMC methods is generally relatively high and the method is not highly parallelizable, since the model solution at each iteration depends on the solution model at the previous iteration; therefore, the applicability of the McMC method to the joint inversion problem in 2D or 3D is unfeasible at the moment.

In the method according to this embodiment, a set of individual rock and fluid models is run in each iteration; hence each iteration step can be parallelized for computational efficiency. A further advantage of this embodiment of the invention is that an estimate of model uncertainty is obtained.

Figure 8A:
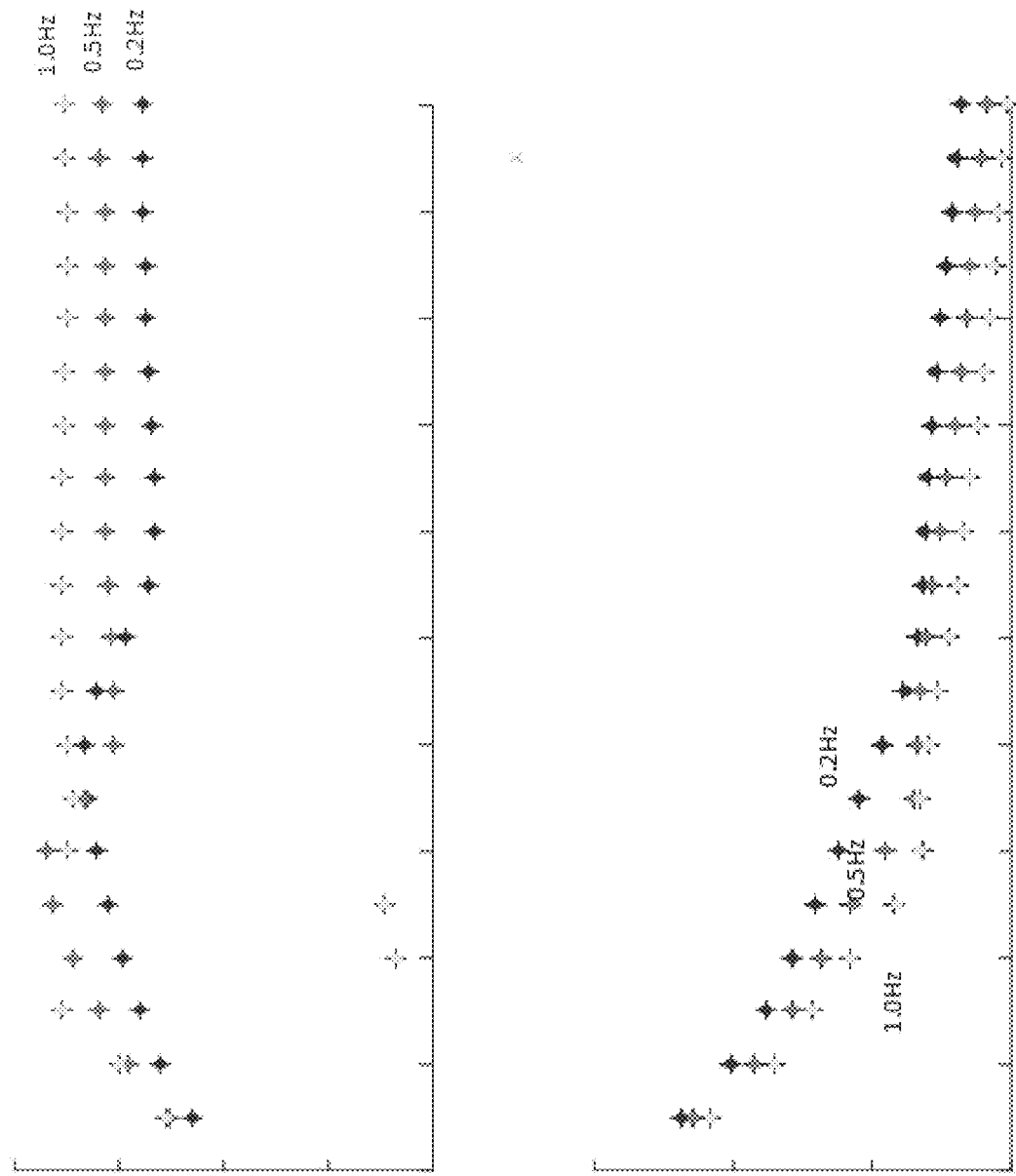
FIG. 8a This figure shows a synthetic offshore CSEM amplitude and phase dataset (as an example) generated by forward modelling from a well log based resistivity model. Hereinafter, any synthetic data will be treated as being survey data collected from a seismic survey, a CSEM survey or from both.

A simple example of the steps of the method is shown in FIGS. 8a, 8b and 9a and 9b. FIG. 8a shows a synthetic CSEM amplitude and phase dataset, generated by forward modelling from a well log based resistivity model (crosses) being said synthetic CSEM amplitude and phase dataset interpreted as data obtained from a CSEM survey allowing to compare the method according to this embodiment with said synthetic data. Solid circles show the response of the final rock and fluid model after reaching the convergence.

Amplitude and phase at three frequencies (0.2, 0.5 and 1 Hz) are plotted against source-receiver separation of the CSEM survey.

Figure 8B:
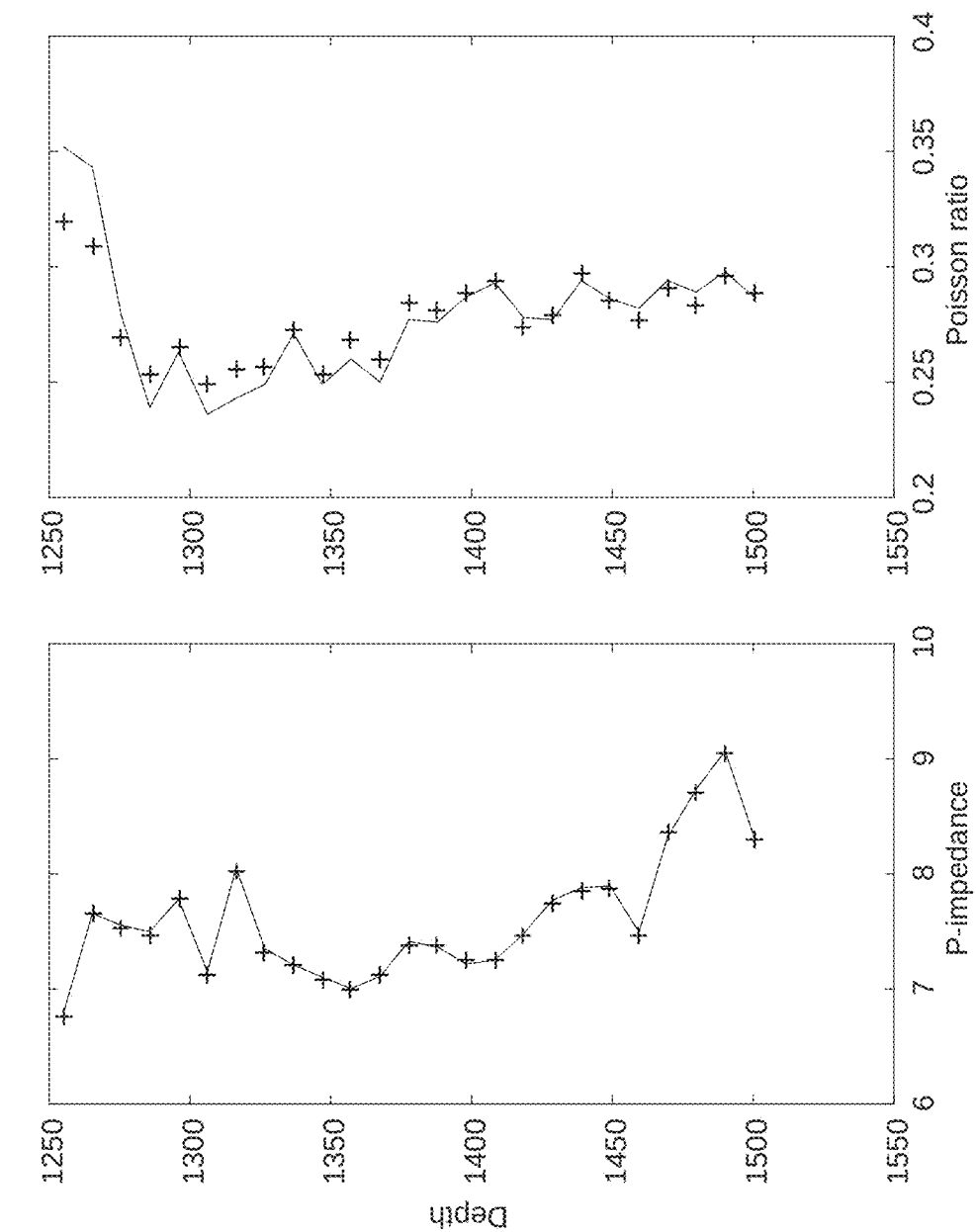
FIG. 8b This figure shows the P-impedance and the Poisson ratio generated as synthetic elastic properties from the same well as the CSEM electromagnetic data.

FIG. 8b shows synthetic elastic properties, in this case P-impedance and Poisson's ratio, in the reservoir interval of interest, generated from the same well as the CSEM electromagnetic data using an elastic rock physics model correlation (solid curve). In this case, synthetic elastic properties are also generated by a computer identifying said synthetic elastic properties with those elastic properties that would be obtained from the inversion of seismic survey data. This synthetic data allows the convergence of the method according to this embodiment to be validated. FIG. 8b shows the synthetic elastic properties using a solid line and the response of the final rock and fluid model when reaching the convergence criteria using crosses.

The goal is to invert these two datasets using the method according to the third embodiment, to recover the underlying porosity, clay content and water saturation.

In this example, the ensemble consisted of 1000 individual rock and fluid models ($N_e$=1000), the number of assimilations or updates, $N_a$, was 4, and the optimisation parameters, i.e. the elements of the matrix $C_D$, were set to be equal to 0 outside the diagonal and 1/10 of the variance of the data on the diagonal.

Figure 9A:
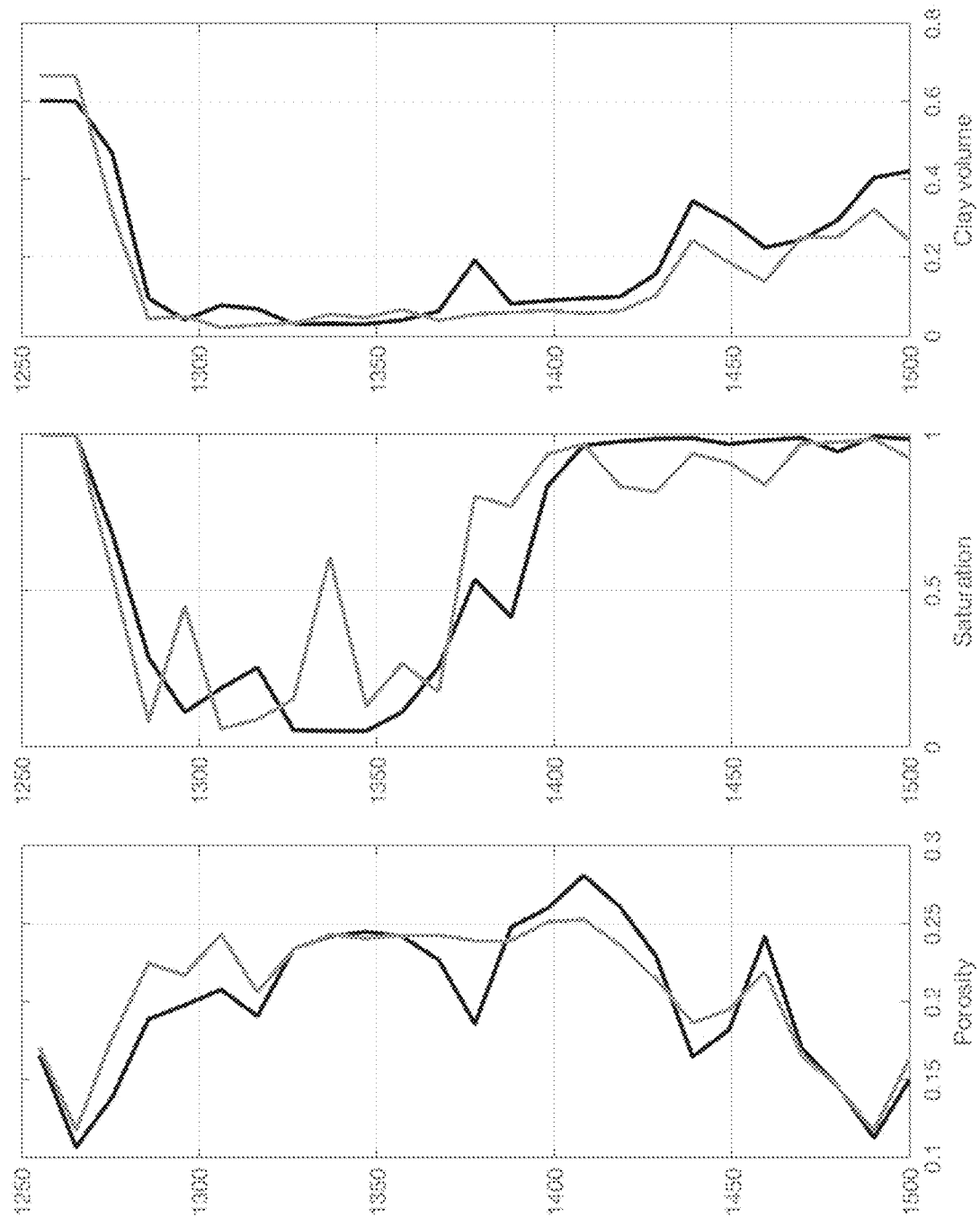
FIG. 9a, 9b These figures show the results of the method according to the third embodiment.
Figure 9B:
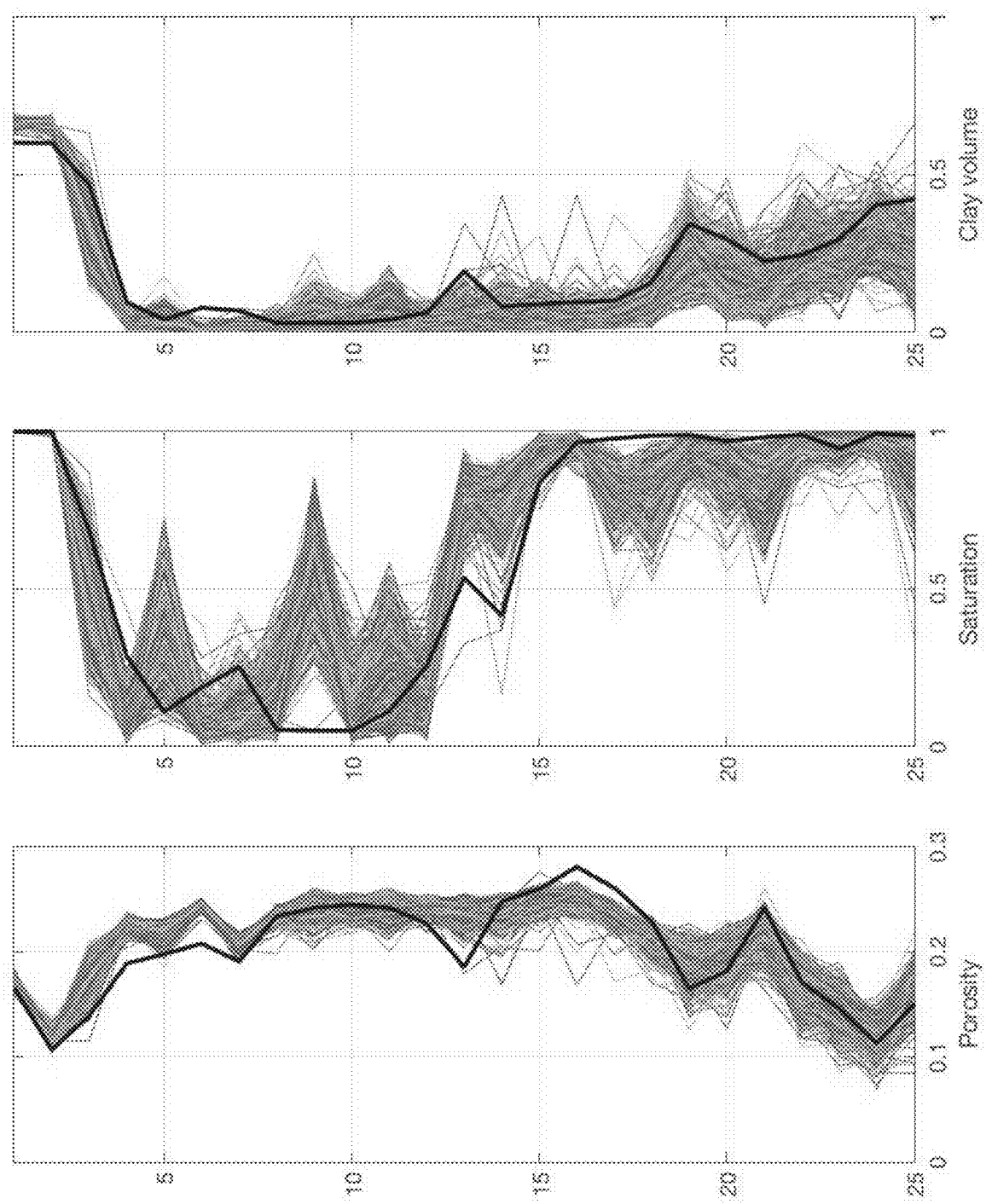

FIGS. 9a and 9b show the results of the method according to this third embodiment. FIG. 9a shows the mean of the final ensemble of the rock and fluid model, the one obtained after convergence of the method (grey curve), compared to the true model (black curve).

The CSEM response of the final rock and fluid model is compared to the data (solid circles) in FIG. 8a. Similarly, the elastic response of the final rock and fluid model is shown in FIG. 8b (crosses).

FIG. 9b shows the complete updated ensemble of 1000 individual rock and fluid models along with the true model (solid and thick black curve), with the spread in values indicative of the uncertainty in the estimation of porosity, clay content and water saturation (using a plurality of fine lines, one per individual rock and fluid model).

A good agreement between the inverted porosity, clay content and saturation and the true values is achieved.

The fourth embodiment of the invention uses stochastic sampling of reservoir properties derived from seismic data, followed by rejection sampling.

Steps a), b) and c) are carried out providing the elastic model and then, a plurality of individual rock and fluid models with the resolution of the seismic model are generated populating the porosity, lithology and $S_w$ on the basis of the seismic model.

The method according to this embodiment selects a sub-set among these individual rock and fluid models by matching their CSEM response to the measured data in the CSEM electromagnetic survey, retaining only those individual rock and fluid models with a misfit less than a user defined tolerance.

This approach has two main advantages: firstly the resolution of the seismic is retained throughout the process, and secondly, this method provides an indication of the uncertainty in the result.

Figure 10:
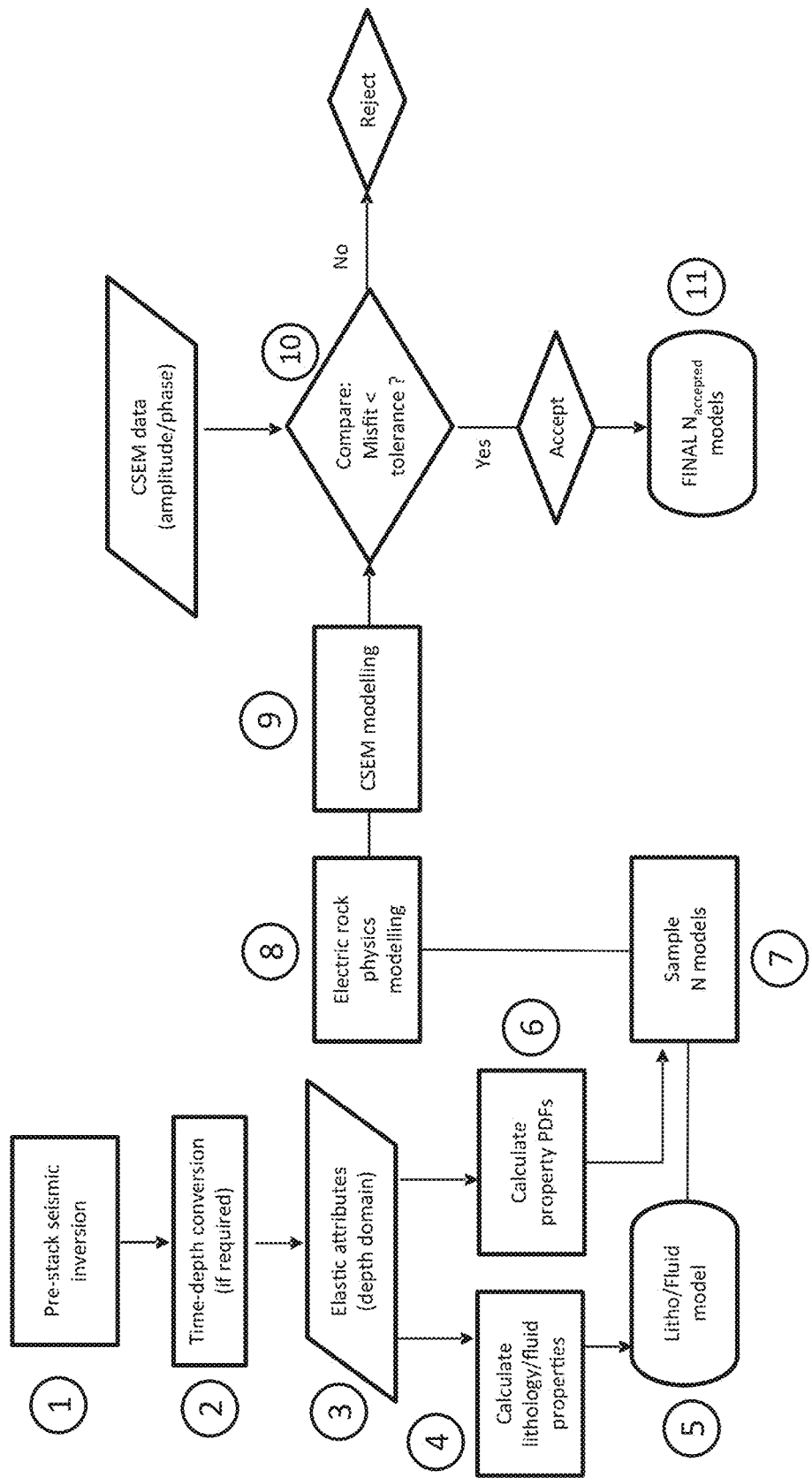
FIG. 10 This figure shows a schematic representation of the steps of a forth embodiment of the method of the invention.

The main steps according to this embodiment are illustrated in FIG. 10.

In the first step of the method, seismic data, preferably pre-stack seismic data, are inverted to yield elastic impedance properties; that is, the elastic model (1). As in former embodiments, numbers only show the order of the method according to this example.

Either a deterministic (such as the first and second embodiment) or stochastic (such as the third and fourth embodiment) inversion algorithm could be applied. If not already in depth, the resulting elastic properties must be converted from time to depth (2), to yield elastic properties of the elastic model in the depth domain (3).

The elastic properties are then used to calculate rock and fluid properties (4) generating the rock and fluid model, for example porosity, clay content, water saturation (5).

The resulting rock and fluid model may be 1D, 2D or 3D. Seismic facies may also be defined at this stage. Methods such as the multi-attribute rotation scheme (MARS) or statistical rock physics could be used for this purpose. In addition, probability density functions (PDFs) for the derived rock and fluid properties of the rock and fluid model must be calculated (6).

If a stochastic seismic inversion process was applied in step 1 when generating the elastic model, then these can be derived from the inversion output. If not then PDFs can be derived from statistical rock physics approaches, or assumed based on prior knowledge of the likely distributions.

The next stage is to sample the rock and fluid model using a stochastic approach (7). Note that the PDFs defined at different points in the elastic model may not be sampled independently, since the resulting models would be unreasonably rough and not representative of real geology. The realizations must therefore be spatially correlated. The realizations can be generated, for example, using the probability field simulation method of Srivastava (1992).

$$x_i^s(u) = x_i^{mean}(u) + \sigma_i(u) \in_i (u)$$

where x is the property to be sampled (for example porosity, clay content or saturation), u(i,j,k) is the grid cell location (for instance in a 3D case) in the numerical model, $x_i^s(u)$ is the simulated value at position u, $x_i^{mean}$ is the mean value, $\sigma_i$ is the standard deviation of the property to be sampled, and $\in_i$ is a spatially correlated error field.

The trend of the mean can be obtained from the seismically derived inversion results, and the standard deviation either assumed, or calculated from the seismic inversion output (1) or the rock and fluid model (4).

The number of individual rock and fluid models sampled, $N_e$, is defined by the user, and could be for example 1000.

For each of the $N_e$ individual rock and fluid models comprising lithology and fluid properties, $N_e$ individual rock and fluid models with electric rock physics properties are also generated in the rock and fluid model to calculate $N_e$ equivalent models of resistivity (8).

Preferably these individual rock and fluid models with electric rock physics properties should account for electrical anisotropy in the earth so that the resulting resistivity models are also anisotropic.

For each of the $N_e$ individual rock and fluid models of resistivity a forward modelling approach in 1D, 2D or 3D (depending on the dimensionality of the models) is used to calculate the equivalent CSEM amplitude and phase response (9) by simulation.

In the final step the misfit between the observed and calculated responses are calculated (10). The misfit could be defined as (for example) the $\mathcal{L}^2$-norm between calculated and observed values.

Any model with a misfit greater than the user-defined tolerance is rejected, leaving a population of $N^{accepted}$ final models. Alternatively the user could define $N^{accepted}$, and accept the $N^{accepted}$ models with lowest misfit (11).

FIGS. 11a, 11b and 12a and 12b show a simple synthetic example of the proposed method.

Figure 11A:
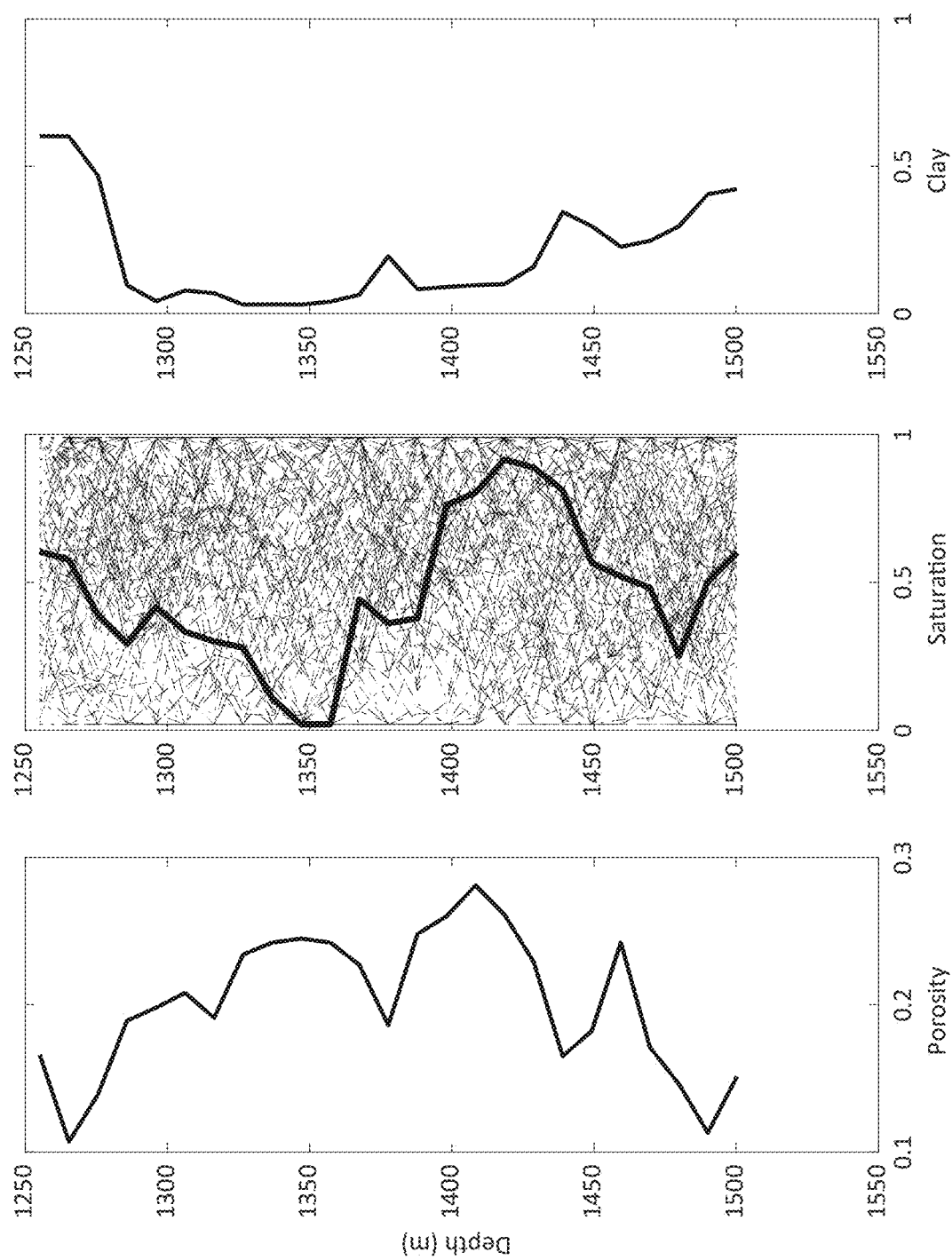
FIG. 11a, 11b These figures show the porosity, water saturation and clay content determined by a rock and fluid model comprising a large amount of individual rock and fluid models sampled from seismic data and a selection of said individual rock and fluid models showing a response being compatible with the synthetic CSEM electromagnetic data resulting in the lowest second misfit.
Figure 11B:
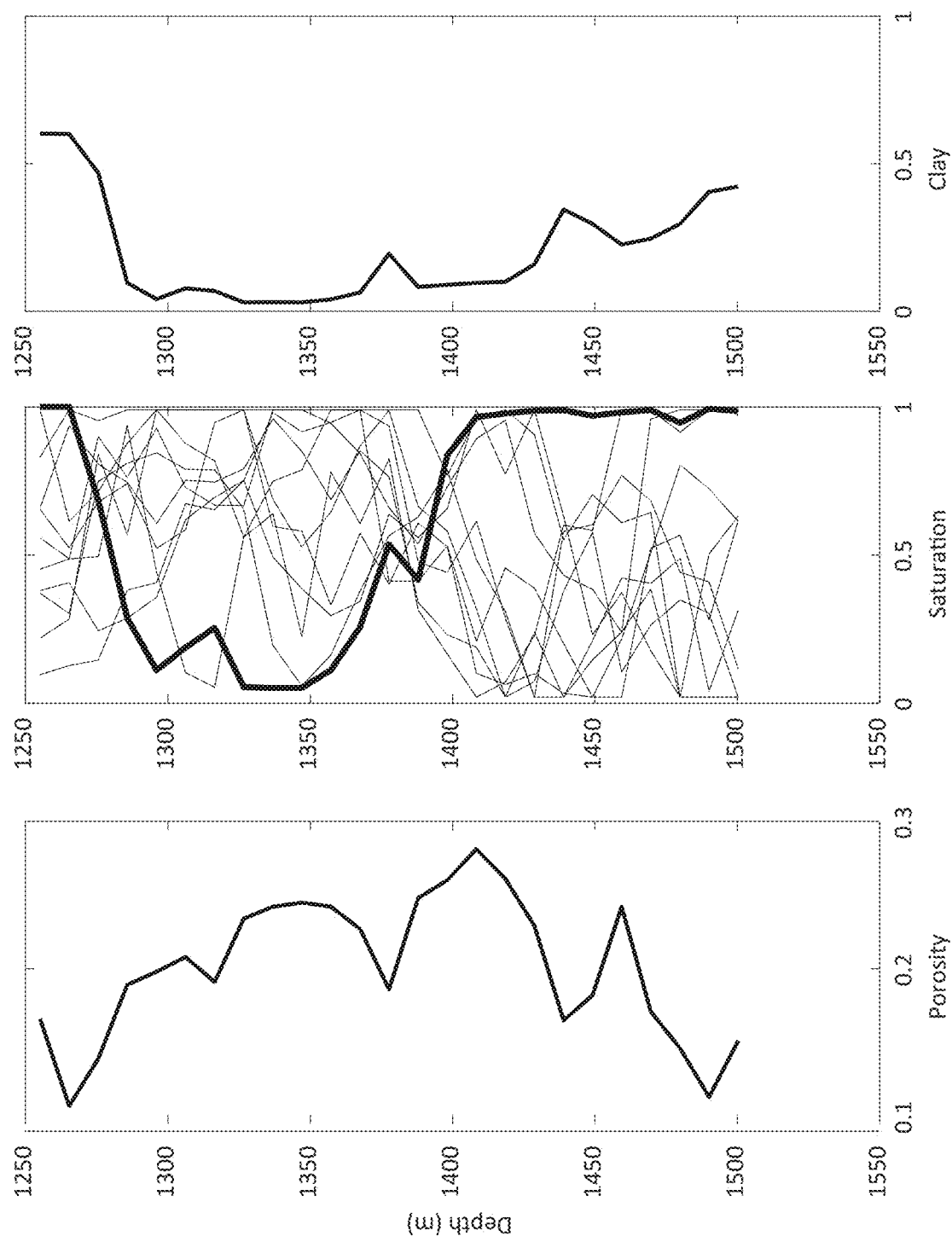

FIG. 11a shows the porosity, saturation and clay content within a reservoir (thick black solid lines). In the proposed method these would be estimated using seismic data.

In this example porosity and clay content are assumed known. Therefore 100 realizations of the water saturation have been generated (FIG. 11a, fine lines).

The simulations are generated using a vertical correlation range (50 meters) and assuming an average saturation of 0.5 in the entire interval.

The Simandoux model, which links electrical resistivity to the underlying porosity, clay content and water saturation was then used to generate 100 equivalent resistivity models, and the CSEM amplitude and phase response of each of the models was calculated using a 1D forward modelling algorithm. The resulting responses are shown using fine lines in FIG. 12a. In this figure the CSEM amplitude and phase of the true model (the observed data collected in the CSEM electromagnetic survey) is shown by the solid circles, for signal frequencies of 0.2, 0.5 and 1 Hz.

Figure 12A:
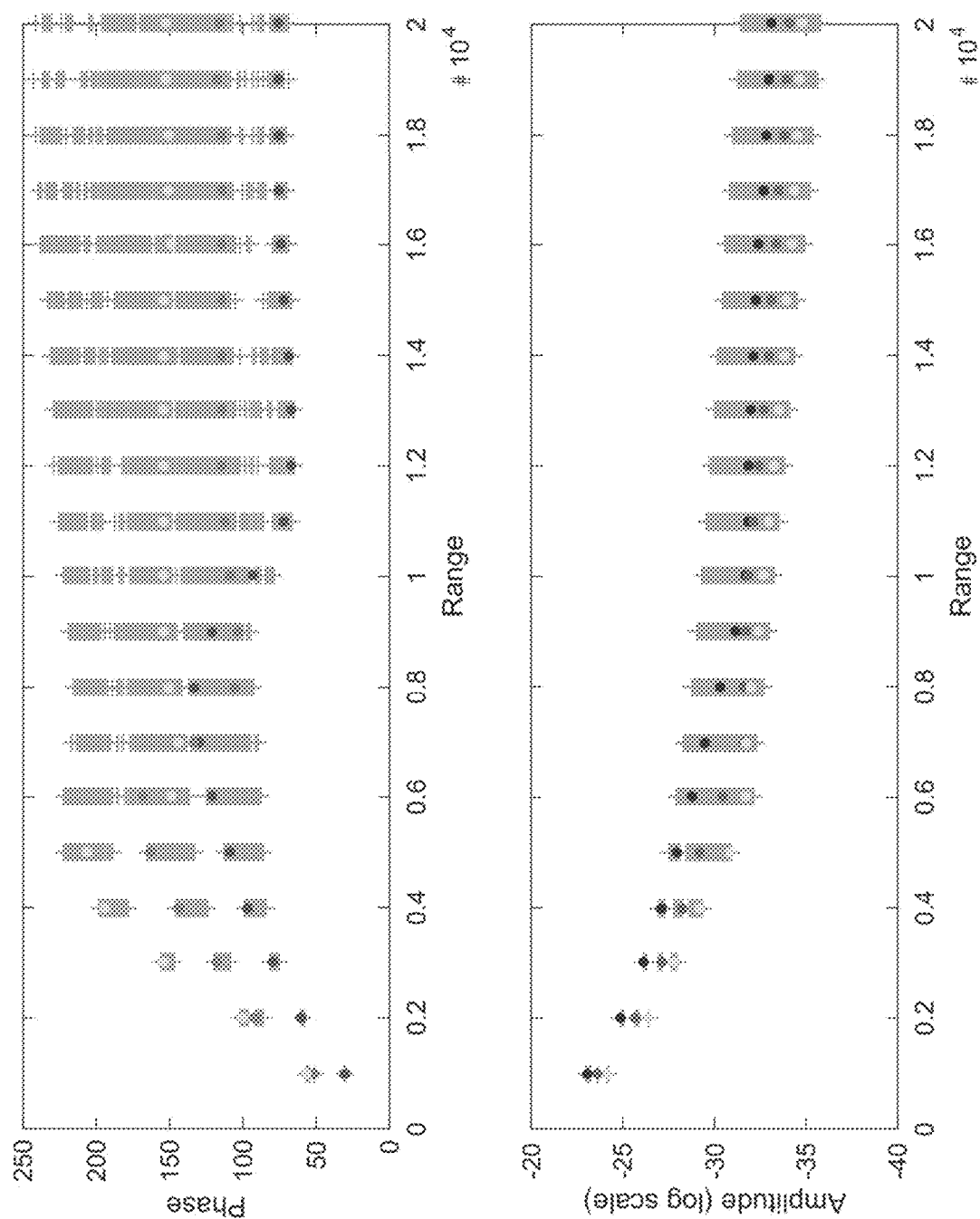
FIG. 12a This figure shows the phase and amplitude response of the rock and fluid model according to the fourth embodiment.
Figure 12B:
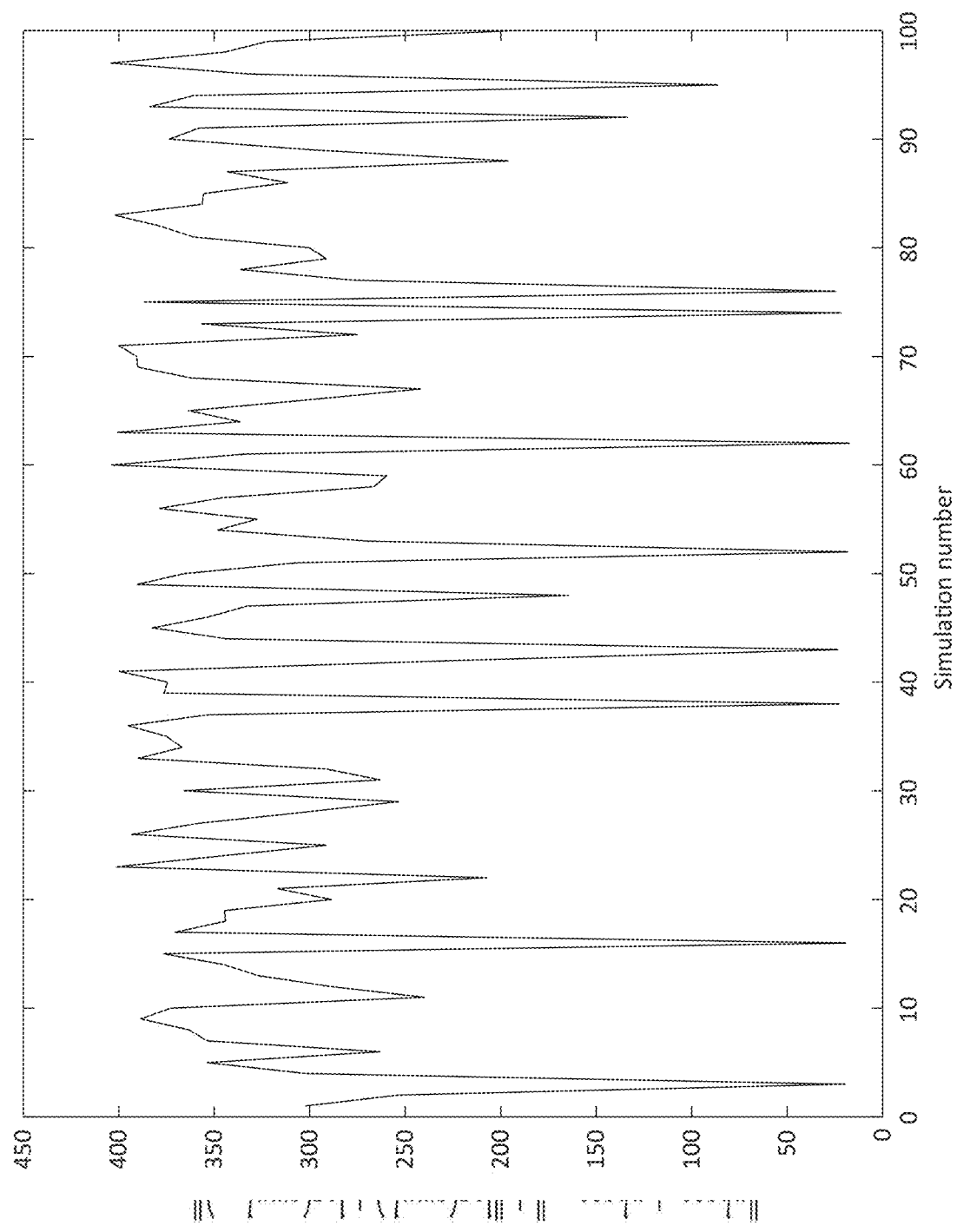
FIG. 12b This figure shows the misfit between the observed CSEM response and the response calculates from 100 model realisations.

FIG. 12b shows the misfit between the observed CSEM response and the response calculated from the 100 model realisations. In this example the 10 realisations with the lowest misfit were accepted: these are plotted in FIG. 11b. Although there is still some variability in the responses, the average saturation in the reservoir interval (which is well constrained by the CSEM method) is recovered accurately.

The invention claimed is:

1. A computer implemented method for analysing a seismic survey dataset and an electromagnetic survey dataset to generate a sub-surface rock and/or fluid model of a specified domain, said method comprising:
   a) generating an acoustic and/or elastic model of the sub-surface domain based on a seismic survey data;
   b) generating a rock and/or fluid model populated with rock and/or fluid properties based on the elastic model compatible with acoustic data or on the acoustic model and, wherein the rock and/or fluid model is at a resolution of the acoustic model or the elastic model;
   c) iteratively, carrying out the following steps:
      determining a misfit according to:
      i. determining the acoustic or elastic response of the rock and/or fluid model and, determining a first misfit between said acoustic or elastic response and the acoustic and/or elastic model; or
      ii. determining the electric properties of the rock and/or fluid model wherein the electric properties are at the scale of the acoustic or elastic model and, determining the electromagnetic response of the rock and/or fluid model according to the electric properties under a simulation of electromagnetic response corresponding to the electromagnetic survey dataset, the simulation being a numerical simulation of the electric properties derived from the rock and/or fluid model for determining the electromagnetic response according to the rock and/or fluid properties of said model and to an electromagnetic source reproducing the electromagnetic fields of the electromagnetic survey and, determining a second misfit between said electromagnetic response and the electromagnetic survey dataset at the locations of a set of electromagnetic sensors of the electromagnetic survey; or iii. determining both the first misfit and the second misfit according to step i) and step ii), respectively;

updating the properties of the rock and/or fluid model; wherein the iterations are carried out until the first misfit, if determined, is under a first predetermined value and the second misfit, if determined, is under a second predetermined value.

2. The method according to claim 1, wherein determining the acoustic or elastic response of the rock and/or fluid model of step i) comprises a numerical simulation of the rock and fluid model for determining the acoustic and/or elastic response according to the rock and/or fluid properties of said model.

3. The method according to claim 1, wherein the rock properties include at least one of porosity, clay content, and water saturation.

4. The method according to claim 1, wherein elastic properties of the elastic model include at least one of a P-impedance, a S-impedance, density, Poisson's ratio, Lamé impedances lambda-rho ($\lambda\rho$) and mu-rho ($\mu\rho$), and Vp/Vs ratio, wherein Vp is P-wave velocity and Vs is S-wave velocity.

5. The method according to claim 1, wherein the elastic response is:
  generated by using a stiff sand model; or
  generated by using a soft sand model; or
  generated by using a rock physics model linking elastic properties, rock properties, and fluid properties; or
  generated statistically from a relationship between elastic/acoustic response and rock and fluid properties measured in well log data; or
  generated by any combination thereof.

6. The method according to claim 1, wherein the electric properties include at least one of horizontal resistivity, vertical resistivity, bed parallel resistivity, bed perpendicular resistivity, and anisotropy ratio.

7. The method according to claim 1, wherein the elastic response is:
  generated by using Archie's model; or
  generated by using the Simandoux model; or
  generated by using a rock physics model linking electric properties, rock properties, and fluid properties; or
  generated statistically from a relationship between electric response and rock and fluid properties observed in well log data; or
  generated by any combination thereof.

8. The method according to claim 1, wherein an iterative step d) is according to sub-step iii) and wherein the properties of the rock and/or fluid model being updated are at least one of the rock and/or fluid properties.

9. The method according to claim 1, wherein the rock and/or fluid model is a rock and fluid model comprising rock properties and fluid properties and, wherein an iterative step d) combines a sequential process with a first group of iterations according to sub-step i) updating at least one of the properties of the rock and fluid model to minimize the first misfit and a second group of iterations according to sub-step ii) updating at least one of the fluid properties of the rock and fluid model to minimize the second misfit.

10. The method according to claim 1, wherein
the rock and/or fluid model is a rock and fluid model comprising rock properties and fluid properties and, wherein the rock and fluid model comprises a plurality $N_e$ of individual rock and fluid models $m_j$, $j=1 \ldots N_e$ each with different rock and fluid property attributes, being each individual rock and fluid model $m_j$ at the resolution of the acoustic model or the elastic model and, being each rock and fluid property attribute dependent on the elastic model or the acoustic model;

updating the properties of each of the individual rock and fluid models $m_j$ using a Bayesian updating process such that the first misfit, the second misfit or both are minimised; and, step d) comprises:
  calculating the average of the plurality of individual rock and fluid models $m_j$, $j=1 \ldots N_e$,
  calculating uncertainty over the plurality of individual models, preferably the standard deviation, to provide an estimate of model uncertainty; and
  making available both values in the model ensemble, the average model and the model uncertainty.

11. The method according to claim 10, wherein the updating process perturbs the properties of the rock and fluid model comprising a predetermined $N_a$ number of updating sub steps, where the amplitude of the updates is decreased from the first updating substep to the last updating substep.

12. The method according to claim 11, wherein the updates in the individual rock and fluid model $m_j$, is performed using the following relationship:

$$m_j^p := m_j^f + C_{MD}^f (C_{DD}^f + \alpha_i C^d)^{-1} (d_{uc,j} - d_j^f)$$

wherein
  ":=" denotes the updating process as an update from former values,
  the superscript "p" denotes the updated value of the property,
  the superscript "f" denotes the previous model value of the property,
  $C_{MD}^f$ is the cross covariance matrix between the prior vector of model parameters $m^f$ and the vector of predicted data $d^f$,
  $C_{DD}^f$ is the autocovariance matrix of predicted data,
  $\alpha_i$ a number of updates being $\alpha_i \in [1, N_a]$ and,
  $d_f^j$ is the predicted response from the $m_j$ individual rock and fluid model,
  and $d_{uc}$ is given by $$d_{uc} = d_{obs} + \sqrt{\alpha_i} C_D^{1/2} z_d \text{ where } z_d \sim N(0, I_{N_d})$$

wherein
  $d_{uc}$ is the updated vector of observed data,
  $d_{obs}$ the observed property, that is, the elastic/acoustic properties determined from the seismic survey data and the electromagnetic data observed in the CSEM electromagnetic survey data,
  $\alpha_i$ a number of perturbing updates being $\alpha_i \in [1, N_a]$ and,
  $C_D$ the covariance matrix,
  $z_d$ a sampled value of a Gaussian distribution.

13. The method according to claim 10, wherein the plurality of individual rock and fluid models is generated as follows:

step d) comprises generating a plurality of individual rock and fluid models by stochastic sampling of the reservoir properties dependent only on the acoustic or elastic model;

steps c.i-c.iii are carried out for the plurality of individual rock and fluid models and wherein step d) further comprises selecting the subset of the generated individual rock and fluid models for which the electromagnetic response under a simulation of the EM electromagnetic survey match the electromagnetic survey data within a user defined tolerance.

14. The method according to claim 10, wherein the iteration over the plurality of individual rock and fluid models is computed in a parallel manner by grouping the computation of one or more individual rock and fluid models in a separated processor.

15. A computer program product comprising instructions which, when the program is executed by a computer, causes the computer to carry out a method according to claim 1.

* * * * *